(12) United States Patent
Shimizu

(10) Patent No.: US 7,960,187 B2
(45) Date of Patent: *Jun. 14, 2011

(54) RECOVERY PROCESSING METHOD TO BE ADOPTED IN SUBSTRATE PROCESSING APPARATUS, SUBSTRATE PROCESSING APPARATUS AND PROGRAM

(75) Inventor: Noriaki Shimizu, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 404 days.

This patent is subject to a terminal disclaimer.

(21) Appl. No.: 12/048,129

(22) Filed: Mar. 13, 2008

(65) Prior Publication Data

US 2008/0223298 A1 Sep. 18, 2008

Related U.S. Application Data

(62) Division of application No. 11/337,464, filed on Jan. 24, 2006, now Pat. No. 7,364,922.

(60) Provisional application No. 60/663,260, filed on Mar. 21, 2005.

(30) Foreign Application Priority Data

Jan. 24, 2005 (JP) ................................. 2005-016174

(51) Int. Cl.
*H01L 21/00* (2006.01)
(52) U.S. Cl. ............................... 438/5; 700/121; 118/663
(58) Field of Classification Search ....... 438/5; 118/663
See application file for complete search history.

(56) References Cited

U.S. PATENT DOCUMENTS

| 5,570,990 | A | * | 11/1996 | Bonora et al. ................. 414/543 |
|---|---|---|---|---|
| 6,216,051 | B1 | | 4/2001 | Hager et al. |
| 7,244,932 | B2 | | 7/2007 | Nakasuji et al. |
| 7,409,253 | B2 | * | 8/2008 | Shimizu et al. ................. 700/96 |
| 2006/0011296 | A1 | | 1/2006 | Higashi et al. |
| 2006/0149403 | A1 | | 7/2006 | Shimizu et al. |
| 2006/0176928 | A1 | | 8/2006 | Nakamura et al. |
| 2006/0182616 | A1 | | 8/2006 | Weniger |
| 2006/0190120 | A1 | | 8/2006 | Yajima et al. |
| 2007/0197046 | A1 | | 8/2007 | Mizutani et al. |

FOREIGN PATENT DOCUMENTS

| JP | 7-29958 | 1/1995 |
|---|---|---|
| JP | 11-16986 | 1/1999 |
| JP | 11-330185 | 11/1999 |
| JP | 2001-338964 | 12/2001 |
| JP | 2004-319961 | 11/2004 |

* cited by examiner

*Primary Examiner* — W. David Coleman
(74) *Attorney, Agent, or Firm* — Oblon, Spivak, McClelland, Maier & Neustadt, L.L.P.

(57) ABSTRACT

The present invention provides a recovery processing method to restore the substrate processing apparatus to an operating state after correcting an abnormality having occurred in the substrate processing apparatus in operation and having resulted in a stop in the operation, comprising a substrate retrieval step in which substrate salvage processing is first executed for a wafer W left in a chamber in the substrate processing apparatus in correspondence to the extent to which the wafer has been processed at the time of the operation stop and the substrate having undergone the substrate salvage processing is then retrieved into the cassette storage container and an apparatus internal state restoration step in which the states inside the individual chambers of the substrate processing apparatus are restored.

40 Claims, 14 Drawing Sheets

FIG. 3

WAFER STORAGE INFORMATION 292

| CONTAINER NAME | SERIAL NUMBER | WAFER ID | WAFER STORAGE STATUS | RECOVERY PROCESSING | WAFER PROCESSING STATUS |
|---|---|---|---|---|---|
| 132A | 1 | 132A-01 | YES | NO | PROCESSING COMPLETE |
| | 2 | 132A-02 | YES | NO | PROCESSING COMPLETE |
| | 3 | 132A-03 | YES | NO | PROCESSING COMPLETE |
| | 4 | 132A-04 | YES | NO | PROCESSING COMPLETE |
| | 5 | 132A-05 | YES | NO | PROCESSING COMPLETE |
| | ... | ... | ... | ... | ... |
| | 21 | 132A-21 | YES | YES | PROCESSING COMPLETE |
| | 22 | 132A-22 | NO | YES | RECOVERY PROCESSING IN PROGRESS |
| | 23 | 132A-23 | YES | YES | UNPROCESSED |
| | 24 | 132A-24 | YES | NO | UNPROCESSED |
| | ... | ... | ... | ... | ... |

FIG. 4

WAFER PROCESSING HISTORY INFORMATION

| CONTAINER NAME | SERIAL NUMBER | WAFER ID | PROCESSING NUMBER | WAFER PROCESSING STAGE | ELAPSED TIME |
|---|---|---|---|---|---|
| 132A | 22 | 132A-22 | 1 | WAFER EXTRACTION FROM CASSETTE CONTAINER 132A | START TIME : T1 |
| | | | 2 | ORIENTER | IN : T2<br>OUT : T3 |
| | | | 3 | LOAD-LOCK CHAMBER | IN : T4<br>OUT : T5 |
| | | | 4 | COMMON TRANSFER CHAMBER | IN : T6<br>OUT : T7 |
| | | | 5 | FIRST PROCESSING CHAMBER | IN : T8 |
| | | | 6 | STABILIZING STEP IN FIRST PROCESSING CHAMBER | START : T9<br>END : T10 |
| | | | 7 | ETCHING STEP IN FIRST PROCESSING CHAMBER | START : T11 |
| | | | 8 | ETCHING STEP IN FIRST PROCESSING CHAMBER | STOP TIME : T12 |

RECOVERY PROCESSING METHOD TO BE ADOPTED IN SUBSTRATE PROCESSING APPARATUS, SUBSTRATE PROCESSING APPARATUS AND PROGRAM

CROSS REFERENCE TO RELATED APPLICATIONS

This present divisional application claim the benefit under 35 U.S.C. §120 of utility application Ser. No. 11/337,464, filed Jan. 24, 2006, and also claims the benefit under U.S.C. §119 two Japanese Patent Application No. 2005-016174, filed Jan. 24, 2005 and U.S. Provisional Application No. 60/663, 260, filed Mar. 21, 2005, the entire contents of which are hereby incorporated by reference.

FIELD OF THE INVENTION

The present invention relates to a recovery processing method to be adopted in a substrate processing apparatus when the substrate processing apparatus, which executes a specific type of processing on substrates such as semiconductor wafers or liquid crystal substrate stops operating due to an abnormality, a substrate processing apparatus and a program.

BACKGROUND OF THE INVENTION

A substrate processing apparatus used for substrate processing such as that described above normally comprises a processing unit that includes a plurality of processing chambers where a specific type of processing is executed on substrates, e.g., semiconductor wafers (hereafter may be simply referred to as "wafers") and a transfer unit connected to the processing unit via, for instance, a load-lock chamber.

The processing unit in a cluster tool-type substrate processing apparatus may be constituted by connecting with a high level of airtightness the plurality of processing chambers and the load-lock chambers around a common transfer chamber normally formed in a rectangular shape. Inside the common transfer chamber, a processing unit-side transfer mechanism constituted with a transfer arm and the like is disposed and wafers are transferred between the plurality of processing chambers and the load-lock chamber by the processing unit-side transfer mechanism. A transfer unit-side transfer mechanism also constituted with a transfer arm and the like is installed at the transfer unit, and wafers are transferred between a cassette container (substrate storage container) containing wafers and the load-lock chamber.

A wafer in a substrate storage container such as a cassette container, which is to undergo the specific type of processing in such a substrate processing apparatus, is first transferred out of the cassette container by the transfer unit-side transfer mechanism at the transfer unit. The unprocessed wafer having been transferred out of the cassette container is then delivered to a positioning device (e.g., an orienter or a pre-alignment stage) disposed in the transfer unit for positioning, before it is transferred into the load-lock chamber. Once the unprocessed wafer is correctly positioned, it is transferred out of the positioning device and delivered into the load-lock chamber.

The unprocessed wafer having been transferred into the load-lock chamber is transferred out of the load-lock chamber by the processing unit-side transfer mechanism, is delivered into a processing chamber where it undergoes the specific type of processing. Once the processing is completed in the processing chamber, the processed wafer is transferred out of the processing chamber by the processing unit-side transfer mechanism and is returned to the load-lock chamber. The processed wafer having been returned to the load-lock chamber is delivered back into the cassette container by the transfer unit-side transfer mechanism.

Even while the processing is in progress in the individual processing chambers, unprocessed wafers are constantly transferred out of the cassette container and are made to wait in standby in the common transfer chamber, the load-lock chamber, the positioning device and the like, since it is desirable to maintain a continuous flow of unprocessed wafers waiting in standby at closest possible positions to the processing chambers to assure the maximum processing throughput from the processing chambers in the substrate processing apparatus. Once the processing on a given wafer is completed in a processing chamber, the processed wafer is immediately taken back into the cassette container and the unprocessed wafers having been waiting in standby are sequentially delivered so as to transfer the unprocessed wafer next in line immediately into the processing chamber.

If an abnormality such as a malfunction, a power supply interruption or an electrical leak occurs while the substrate processing apparatus is in operation, the operation is stopped in an emergency by, for instance, turning off the power to the substrate processing apparatus. Under such circumstances, the wafer processing underway within a processing chamber is halted, and the wafer is left inside the processing chamber. In addition, wafers in a wait state in various chambers such as the transfer unit, the common transfer chamber and the load-lock chamber, too, are also left where they are. If pressure control through, for instance, evacuation has been in progress in a given chamber, the pressure control stops as the operation of the substrate processing apparatus is stopped, which may lead to a reverse flow of dirt and dust from the discharge side and particles of the substances deposited during the wafer processing becoming suspended in the air.

In the related art, if the operation of the substrate processing apparatus stops due to such an abnormality, the abnormality must be corrected before an operator can remove the wafers left in the various chambers of the substrate processing apparatus and manually clean the inside of the chambers, such as the transfer unit, the processing chambers, the common transfer chamber and the load-lock chamber so as to restore the substrate processing apparatus to an operating state.

In the event of an emergency stop of the substrate processing apparatus, the recovery operation for the substrate processing apparatus must be executed manually by the operator as described above in the related art, which is bound to be a laborious and time-consuming process. In addition, since the decision as to exactly what processing needs to be further executed on a wafer having partially undergone the processing in the processing chamber when the processing was halted is made based upon, for instance, a log or the like having stored therein the wafer etching state and the like (see, for instance, Japanese Laid Open Patent Publication No. H11-330185), the wafer salvage processing, too, is bound to be a time-consuming and laborious process, requiring the operator to be both experienced and knowledgeable.

As an alternative, when the power to the substrate processing apparatus is turned on after the operation of the substrate processing apparatus has been stopped due to an abnormality and the abnormality has been subsequently corrected, all the wafers remaining in the transfer unit, the processing chambers, the common transfer chamber, the load-lock chamber are automatically retrieved into the original cassette container by engaging the transfer mechanisms described earlier and the handling of the wafers thus retrieved is entrusted to the operator. However, while the operator does not need to be involved in the wafer retrieval process, he still needs to have significant experience and knowledge in handling the retrieved wafers. Since the decision as to what further processing each wafer needs to undergo cannot be made readily, the wafer retrieval processing is still a time-consuming and laborious process.

Furthermore, if all the wafers left in the substrate processing apparatus at the time of the occurrence of the abnormality are automatically retrieved into the initial cassette container as described above, they are invariably exposed to the outside atmosphere regardless of the specific processing steps the individual wafers were at when the operation of the substrate processing apparatus stopped. However, if a wafer at a certain processing stage, e.g., a wafer undergoing continuous processing at a plurality of processing chambers and currently present in the common transfer chamber to be transferred into the next processing chamber or a wafer undergoing processing in a given processing chamber when the processing is halted, is exposed to the outside atmosphere, the wafer may become unsalvageable. Namely, depending upon the type of processing having been halted, e.g., polysilicon etching, the wafer, once exposed to the outside atmosphere, becomes unfit to undergo the remaining processing (such as additional etching post print and the wafer thus becomes unsalvageable.

SUMMARY OF THE INVENTION

Accordingly, an object of the present invention, which has been completed by addressing the problems of the related art discussed above, is to provide a recovery processing method to be adopted in a substrate processing apparatus, a substrate processing apparatus and a program, that minimize the length of time and the labor required in recovery processing for a substrate processing apparatus when the operation thereof is stopped due to an abnormality and also make it possible to salvage a maximum number of substrates by executing optimal salvage processing for the substrates left in the substrate processing apparatus when the operation thereof stops due to an abnormality.

The object described above is achieved in an aspect of the present invention by providing a recovery processing method to be adopted in a substrate processing apparatus, equipped with a plurality of chambers including, at least, a processing chamber where a substrate transferred from a substrate storage container undergoes processing, to restore the substrate processing apparatus to an operating state after correcting an abnormality having occurred in the substrate processing apparatus in operation and having resulted in a stop in the operation, comprising a substrate retrieval step in which substrate salvage processing is first executed for a substrate left in a chamber in the substrate processing apparatus in correspondence to the extent to which the substrate has been processed at the time of the operation stop and the substrate having undergone the substrate salvage processing is then retrieved into the substrate storage container, and an apparatus internal state restoration step in which the states inside the individual chambers of the substrate processing apparatus are restored.

According to the present invention described above, in the event of an operation stop due to the occurrence of an abnormality in the substrate processing apparatus, the processing for restoring the state of the substrate processing apparatus, i.e., the processing for retrieving the substrates left in the substrate processing apparatus and the processing for restoring the state of the substrate processing apparatus, can be executed automatically. Compared to the related art in which the recovery processing needs to be manually executed by an operator, the length of time and the labor required for the recovery processing can be greatly reduced. In addition, by executing optimal salvage processing for each substrate left in the substrate processing apparatus in correspondence to the extent to which it has been processed at the time of the operation stop due to the abnormality, a maximum number of substrates can be salvaged.

The substrate salvage processing executed in the method described above may comprise, for instance, a substrate detection step in which the substrate left in the substrate processing apparatus is detected, a processing extent detection step in which the extent to which the substrate having been detected through the substrate detection step has been processed at the time of the operation stop is detected and a substrate salvage step in which the substrate salvage processing is executed for the substrate having been detected through the substrate detection step in correspondence to the processing extent having been detected through the processing extent detection step.

In this case, if a substrate is detected in the processing chamber in the substrate detection step and the substrate is judged through the processing extent detection step to have been processed to an extent that still requires further processing in the processing chamber, the remaining processing is executed on the substrate in the processing chamber through the substrate salvage step. Thus, if the operation of the substrate processing apparatus is halted while a wafer is undergoing processing in a processing chamber, the remaining processing is first executed on the substrate in the processing chamber before it is retrieved into the substrate storage container. As a result, unlike in the related art, any substrate that has been partially processed when processing in a processing chamber is halted is not retrieved or exposed to the outside atmosphere without first undergoing the remaining processing, and, therefore, can be salvaged.

The substrate processing apparatus may include a storage means for storing substrate processing history information while the substrate processing apparatus is engaged in operation, and in conjunction with such a substrate processing apparatus, the substrate salvage step may be executed by setting a remaining processing time length for a substrate detected in the processing chamber through the substrate detection step, which is also detected through the processing extent detection step to be a processing-in-progress substrate requiring further processing in the processing chamber, based upon the processing history information for the particular substrate stored in the storage means and then executing the remaining processing on the substrate over the remaining processing time length. By setting the remaining processing time length for the substrate based upon the substrate processing history information as described above, it is possible to set the optimal remaining processing time length for the particular substrate, allowing the substrate to be salvaged in a desirable manner.

The substrate processing apparatus may include a defect inspection chamber where a defect inspection is executed by detecting the processing state of a substrate. In conjunction with such a substrate processing apparatus, the substrate salvage step may be executed by transferring to the defect inspection chamber a substrate detected in the processing chamber through the substrate detection step, which is also detected through the processing extent detection step to be a processing-in-progress substrate still needing to go through further processing in the processing chamber, setting a remaining processing time length for the substrate based upon the substrate processing state detected in the defect inspection chamber, and executing the remaining processing on the substrate over the remaining processing time length.

By setting the remaining processing time length for the substrate based upon the substrate processing state detected in the defect inspection chamber as described above, it is possible to set the remaining processing time length in correspondence to the actual processing state of the substrate and thus to salvage the substrate in a more desirable manner.

If a substrate detected through the substrate detection step halfway through a transfer from a given processing chamber to another processing chamber is also detected through the processing extent detection step to be in a processing incomplete state still needing to undergo processing in the other processing chamber, the further processing in the other processing chamber may be executed on the substrate during the substrate salvage step. In this case, if a wafer left in the substrate processing apparatus is in a processing incomplete state, i.e., the wafer has undergone the processing in a given processing chamber but still needs to undergo processing in the other processing chambers, the substrate is retrieved into the substrate storage container only after the processing in the remaining processing chambers is executed on the substrate. This means that a substrate in a processing incomplete state is not retrieved and exposed to the outside atmosphere unlike in the related art, and that the substrate is thus salvaged.

In addition, if a substrate detected in a given chamber through the substrate detection step is also detected through the processing extent detection step to be in a unprocessed state or in a processing complete state, the substrate may be retrieved into the substrate storage container during the substrate salvage step, since a substrate in an unprocessed state or a processing complete state can be retrieved into the substrate storage container and be exposed to the outside atmosphere with no problem. By executing salvage processing in correspondence to the extent to which each substrate has been processed, a maximum number of substrates left in the substrate processing apparatus can be salvaged.

During the apparatus internal state restoration step mentioned earlier, the inside of the individual chambers at the substrate processing apparatus, in conjunction with each of which a gas supply system capable of supplying at least a purge gas and a discharge system capable of pressure adjustment to one atmosphere through evacuation and charging with a purge gas are disposed, may be cleaned. For instance, the individual chambers at the processing unit and the transfer unit of the substrate processing apparatus may each include a gas supply system capable of supplying, at least, a purge gas and a discharge system capable of pressure adjustment to one atmosphere through evacuation and charging with a purge gas. The inside of these chambers may be cleaned by repeatedly executing a cycle of evacuation and charging to switch between a vacuum and atmospheric pressure a specific number of times through the discharge systems while drawing a purge gas (e.g., $N_2$ or an inert gas) through the gas supply systems into the individual chambers of the substrate processing apparatus. Through such cleaning processing, particles (e.g., particles of deposit, dirt and dust) suspended inside the chambers of the substrate processing apparatus can be removed. In addition, by repeating the cycle of evacuation and charging with a purge gas, particles of substances deposited on the wall surfaces of the chambers and also on parts disposed inside the chambers, too, can be peeled off and forcibly lifted, thereby facilitating removal thereof.

The method may further include a reprocessing step in which a decision is made as to whether or not a substrate having been retrieved into the substrate storage container is in an unprocessed state and the substrate undergoes reprocessing if it is detected to be in an unprocessed state. The reprocessing step executed on an unprocessed substrate after it is first retrieved into the substrate storage container can be executed following the apparatus internal state restoration step. In other words, the unprocessed substrate can be processed after the apparatus state is restored, in exactly the same manner as that with which it would have been processed in the substrate processing apparatus if the abnormality had not occurred.

In addition, the substrate processing apparatus may include a particle measurement chamber. In conjunction with such a substrate processing apparatus, each substrate may be transferred into the particle measurement chamber where the quantity of particles present on the substrate is measured before the substrate is retrieved into the substrate storage container and the results of the measurement may be stored into the storage means in correlation with the particular substrate during the substrate retrieval step. In this case, it becomes possible to judge whether or not a substrate having undergone the recovery processing can be reprocessed based upon the results of the measurement of the particle quantity.

The object described above is also achieved in another aspect of the present invention by providing a recovery processing method to be adopted in a substrate processing apparatus, equipped with a processing unit constituted with a plurality of chambers including at least a plurality of processing chambers where substrates are processed, a transfer unit connected to the processing unit, which includes a transfer chamber where the substrates are transferred to/from a substrate storage container for storing the substrates, a transfer unit-side transfer mechanism disposed inside the transfer unit to carry the substrates into/out of the processing unit and a processing unit-side transfer mechanism disposed inside the processing unit to carry the substrates into/out of the processing chambers, to restore the state of the substrate processing apparatus after the operation thereof has been stopped due to an abnormality and the abnormality has been subsequently corrected, comprising a substrate retrieval step in which substrate salvage processing is executed for the substrates left in the processing unit and/or the transfer unit of the substrate processing apparatus in correspondence to the extents to which the substrates have been processed at the time of the operation stop and then the substrates are retrieved into the substrate storage container by engaging the processing unit-side transfer mechanism and/or the transfer unit-side transfer mechanism in operation, and an apparatus internal state restoration step in which the states inside the processing unit and the transfer unit of the substrate processing apparatus are restored.

During the substrate retrieval step, processing unit internal substrate savage processing, through which a substrate left in the processing unit undergoes a detection to determine whether or not the substrate needs to undergo further processing, the remaining processing is executed if the substrate is determined to need further processing and the substrate is then be retrieved into the substrate storage container via the processing unit-side transfer mechanism and the transfer unit-side transfer mechanism, may be executed. If, on the other hand, the substrate is determined to need no further processing, the processing unit internal substrate salvage processing may be executed to immediately retrieve the substrate into the substrate storage container via the processing unit-side transfer mechanism and the transfer unit-side transfer mechanism. A substrate left in the transfer unit may be retrieved into the substrate storage container through transfer unit internal substrate salvage processing executed by engaging the transfer unit-side transfer mechanism in operation.

According to the present invention described above, in the event of an operation stop due to the occurrence of an abnormality in the substrate processing apparatus, the processing for restoring the state of the substrate processing apparatus, i.e., the processing for retrieving substrates left in the processing unit and/or the transfer unit and the processing for restoring the states within the processing unit and/or the transfer unit can be executed automatically. Compared to the related art in which the recovery processing needs to be manually executed by an operator, the length of time and the labor required for the recovery processing can be greatly reduced. In addition, since specific salvage processing is executed for a substrate in correspondence to the location at which it is left, e.g., inside the processing unit or the transfer unit, accurate salvage processing can be executed in correspondence to the extent to which the substrate has been processed. As a result, the maximum number of substrates can be salvaged.

In addition, the substrate processing apparatus may include a storage means for storing substrate processing history information while the substrate processing apparatus is in operation. In conjunction with such a substrate processing apparatus, the processing unit internal substrate salvage processing may be executed by determining through detection whether or not a substrate left in the processing unit needs further processing based upon the processing history information for the substrate stored in the storage means and executing the remaining processing based upon the detection results. The substrate processing apparatus may instead include a defect inspection chamber where a defect inspection is executed by detecting the processing state of the substrate. In conjunction with such a substrate processing apparatus, the processing unit internal substrate salvage processing may be executed by determining through detection as to whether or not a substrate left in the processing unit needs to undergo further processing based upon the processing state of the substrate detected in the defect inspection chamber and executing the remaining processing based upon the detection results. By executing any remaining processing that needs to be executed on the substrate based upon the substrate processing history information or the results of the inspection executed in the defect inspection chamber as described above, the optimal remaining processing time length can be set for the particular substrate, which makes it possible to salvage the substrate in a desirable manner.

During the apparatus internal state restoration step mentioned earlier, the inside of the individual chambers in the processing unit and the transfer unit at the substrate processing apparatus may be cleaned. For instance, the individual chambers at the processing unit and the transfer unit of the substrate processing apparatus may each include a gas supply system capable of supplying, at least, a purge gas and a discharge system capable of pressure adjustment to one atmosphere through evacuation and charging with a purge gas. The inside of these chambers may be cleaned by repeatedly executing a cycle of evacuation and charging to switch between a vacuum and atmospheric pressure over a specific number of times while drawing the purge gas into the individual chambers at the processing unit and the transfer unit of the substrate processing apparatus. The method may further include a reprocessing step in which a decision is made as to whether or not a substrate having been retrieved into the substrate storage container is in an unprocessed state and the substrate undergoes reprocessing if it is detected to be in an unprocessed state. In addition, the substrate processing apparatus may include a particle measurement chamber. In conjunction with such a substrate processing apparatus, each substrate may be transferred into the particle measurement chamber where the quantity of particles present on the substrate is measured before the substrate is retrieved into the substrate storage container and the results of the measurement may be stored into the storage means in correlation with the particular substrate during the substrate retrieval step.

The object described above is also achieved in yet another aspect of the present invention by providing a recovery processing method to be adopted in a substrate processing apparatus equipped with a transfer unit that includes a transfer chamber where substrates are transferred to/from a substrate storage container for storing the substrates, a processing unit that includes a plurality of processing chambers where the substrates are processed connected around a common transfer chamber with and a load-lock chamber that connects the common transfer chamber to the transfer chamber of the transfer unit, a transfer unit-side transfer mechanism disposed inside the transfer chamber of the transfer unit to carry the substrates into/out of the load-lock chamber and a processing unit-side transfer mechanism disposed inside the common transfer chamber of the processing unit to carry the substrates between the load-lock chamber and the individual processing chambers, to restore the state of the substrate processing apparatus after the operation thereof has been stopped due to an abnormality and the abnormality has been subsequently corrected, comprising a substrate retrieval step in which substrate salvage processing is executed for the substrates left in the processing unit and/or the transfer unit of the substrate processing apparatus in correspondence to the extents to which the substrates have been processed at the time of the operation stop and then the substrates are retrieved into the substrate storage container by engaging the processing unit-side transfer mechanism and/or the transfer unit-side transfer mechanism in operation and an apparatus internal state restoration step in which the states inside the individual chambers of the substrate processing apparatus are restored.

In the substrate retrieval step executed in this method, transfer unit internal substrate salvage processing may be executed upon detecting a substrate inside the transfer unit so as to retrieve the detected substrate into the substrate storage container, load-lock chamber internal substrate salvage processing may be executed upon detecting a substrate inside the load-lock chamber so as to retrieve the detected substrate into the substrate storage container after evacuation discharge processing in the load-lock chamber, common transfer chamber internal substrate salvage processing may be executed upon detecting a substrate inside the common transfer chamber so as to make a decision as to whether or not the substrate is in a processing incomplete state and retrieve the substrate into the substrate storage container after executing further processing in remaining processing chambers if the substrate is determined to be in a processing incomplete state or retrieve the substrate immediately into the substrate storage container if it is determined not to be in a processing incomplete state, and processing chamber internal substrate salvage processing may be executed upon detecting a substrate within a processing chamber so as to make a decision as to whether or not the substrate is a processing-in-progress substrate, retrieve the substrate into the substrate storage container after executing the remaining processing in the same processing chamber if the substrate is determined to be a processing-in-progress substrate, or retrieve the substrate immediately into the substrate storage container if it is determined not to be a processing-in-progress substrate.

According to the present invention described above, in the event of an operation stop due to the occurrence of an abnormality in the substrate processing apparatus, the processing for restoring the state of the substrate processing apparatus, i.e., the processing for retrieving substrates left in the processing unit and/or the transfer unit and the processing for restoring the states within the processing unit and/or the transfer unit can be executed automatically. Compared to the related art in which the recovery processing needs to be manually executed by an operator, the length of time and the labor required for the recovery processing can be greatly reduced. In addition, since specific salvage processing is executed for a substrate in correspondence to the location at which it is left, e.g., the transfer unit internal substrate salvage processing, the load-lock chamber internal substrate salvage processing, the common transfer chamber internal substrate salvage processing or the processing chamber internal substrate salvage processing. As a result, optimal salvage processing is executed for each substrate in correspondence to the extent to which it has been processed, and the maximum number of substrates is salvaged.

The substrate processing apparatus may include a storage means for storing substrate processing history information while the substrate processing apparatus is engaged in operation. In conjunction with such a substrate processing apparatus, the processing chamber internal substrate salvage processing may be executed by setting a remaining processing time length for a substrate left in a processing chamber and determined to be a processing-in-progress substrate based upon the processing history information for the substrate stored in the storage means and then executing the remaining processing on the substrate over the remaining processing time length. The substrate processing apparatus may instead include a defect inspection chamber where a defect inspection is executed by detecting the processing state of a substrate. In conjunction with such a substrate processing apparatus, the processing chamber internal substrate salvage processing may be executed by transferring a substrate left in a processing chamber and determined to be a processing-in-progress substrate into the defect inspection chamber, setting a remaining processing time length for the substrate based upon the processing state of the substrate detected in the defect inspection chamber and executing the remaining processing on the substrate over the remaining processing time length. By setting the remaining processing time for the substrate based upon the substrate processing history information or the results of the inspection executed in the defect inspection chamber as described above, the optimal length of remaining processing time can be set for the particular substrate, which makes it possible to salvage the substrate in a desirable manner.

During the apparatus internal state restoration step mentioned earlier, the inside of the individual chambers in the processing unit and the transfer unit at the substrate processing apparatus may be cleaned. The individual chambers at the processing unit and the transfer unit of the substrate processing apparatus may each include a gas supply system capable of supplying, at least, a purge gas and a discharge system capable of pressure adjustment to one atmosphere through evacuation and charging with a purge gas. The inside of these chambers may be cleaned by repeatedly executing a cycle of evacuation and charging to switch between a vacuum and atmospheric pressure a specific number of times through the discharge systems while drawing the purge gas through the gas supply systems into the individual chambers in the processing unit and the transfer unit of the substrate processing apparatus. The method may further include a reprocessing step in which a decision is made as to whether or not a substrate having been retrieved into the substrate storage container is in an unprocessed state and the substrate undergoes reprocessing if it is detected to be in an unprocessed state. In addition, the substrate processing apparatus may include a particle measurement chamber. In conjunction with such a substrate processing apparatus, each substrate may be transferred into the particle measurement chamber where the quantity of particles present on the substrate is measured before the substrate is retrieved into the substrate storage container and the results of the measurement may be stored into the storage means in correlation with the particular substrate during the substrate retrieval step.

The object described above is also achieved in still another aspect of the present invention by providing a substrate processing apparatus that processes the substrates, comprising a processing unit constituted with a plurality of chambers including at least a plurality of processing chambers where substrates are processed, a transfer unit connected to the processing unit, which includes a transfer chamber where the substrates are transferred to/from a substrate storage container for storing the substrates, a transfer unit-side transfer mechanism disposed inside the transfer unit to carry the substrates into/out of the processing unit, a processing unit-side transfer mechanism disposed inside the processing unit to carry the substrates into/out of the processing chambers and a control means for restoring the state of the substrate processing apparatus after the operation thereof has been stopped due to an abnormality and the abnormality has been subsequently corrected. The control means in this substrate processing apparatus includes a substrate retrieval means for retrieving the substrates left in the processing unit and/or the transfer unit of the substrate processing apparatus into the substrate storage container via the processing unit-side transfer mechanism and/or the transfer unit-side transfer mechanism after executing substrate salvage processing on the substrates in correspondence to the extents to which the substrates have been processed at the time of the operation stop and an apparatus internal state restoration means for restoring the states inside the processing unit and the transfer unit of the substrate processing apparatus.

According to the present invention described above, in the event of an operation stop due to the occurrence of an abnormality in the substrate processing apparatus, the processing for restoring the state of the substrate processing apparatus, i.e., the processing for retrieving substrates left in the processing unit and/or the transfer unit and the processing for restoring the states within the processing unit and/or the transfer unit is automatically executed. Compared to the related art in which the recovery processing needs to be manually executed by an operator, the length of time and the labor required for the recovery processing can be greatly reduced. In addition, since specific salvage processing is executed for each substrate in correspondence to the extent to which the substrate has been processed, the maximum number of substrates can be salvaged.

The object described above is also achieved in yet another aspect of the present invention by providing a substrate processing apparatus that processes substrates, comprising a transfer unit that includes a transfer chamber where the substrates are transferred to/from a substrate storage container for storing the substrates, a processing unit that includes a plurality of processing chambers where the substrates are processed connected around a common transfer chamber and a load-lock chamber that connects the common transfer chamber to the transfer chamber of the transfer unit, a transfer unit-side transfer mechanism disposed inside the transfer chamber of the transfer unit to carry the substrates into/out of the load-lock chamber, a processing unit-side transfer mechanism disposed inside the common transfer chamber of the processing unit to carry the substrates between the load-lock chamber and the individual processing chambers and a control means for restoring the state of the substrate processing apparatus after the operation thereof has been stopped due to an abnormality and the abnormality has been subsequently corrected. The control means in this substrate processing apparatus includes a substrate retrieval means for retrieving substrates left in the individual chambers at the processing unit and/or the transfer unit of the substrate processing apparatus into the substrate storage container via the processing unit-side transfer mechanism and/or the transfer unit-side transfer mechanism after executing substrate salvage processing on them in correspondence to the extents to which they have been processed at the time of the operation stop and an apparatus internal state restoration means for restoring the states inside the individual chambers of the substrate processing apparatus.

According to the present invention described above, in the event of an operation stop due to the occurrence of an abnormality in the substrate processing apparatus, the processing for restoring the state of the substrate processing apparatus, i.e., the processing for retrieving substrates left in the processing unit and/or the transfer unit and the processing for restoring the states in the individual chambers at the processing unit and/or the transfer unit is automatically executed. Compared to the related art in which the recovery processing needs to be manually executed by an operator, the length of time and the labor required for the recovery processing can be greatly reduced. In addition, since specific salvage processing is executed for a substrate in correspondence to the extent to which it has been processed, the maximum number of substrates can be salvaged.

The object described above is achieved in yet another aspect of the present invention by providing a program used to execute recovery processing for a substrate processing apparatus, equipped with a plurality of chambers including at least a processing chamber where a substrate transferred from a substrate storage container undergoes processing, to restore the substrate processing apparatus to an operating state after correcting an abnormality having occurred in the substrate processing apparatus in operation and having resulted in a stop in the operation. The program enables a computer to execute substrate retrieval processing through which substrate salvage processing is first executed for a substrate left in each chamber in the substrate processing apparatus in correspondence to the extent to which the substrate has been processed at the time of the operation stop and the substrate having undergone the substrate salvage processing is then retrieved into the substrate storage container and apparatus internal state restoration processing through which the states inside the individual chambers of the substrate processing apparatus are restored.

The substrate salvage processing may comprise, for instance, substrate detection processing through which a substrate left in the substrate processing apparatus is detected, processing extent detection processing through which the extent to which the substrate having been detected through the substrate detection step has been processed at the time of the operation stop is detected and substrate salvage processing through which the substrate salvage processing is executed for the substrate having been detected through the substrate detection processing in correspondence to the processing extent having been detected through the processing extent detection processing.

According to the present invention described above, the processing for restoring the state of the substrate processing apparatus after the operation of the substrate processing apparatus has been stopped due to an abnormality, i.e., the processing for retrieving substrates left in the substrate processing apparatus and the processing for restoring the state inside the substrate processing apparatus, can be automatically executed by the computer. Compared to the related art in which the recovery processing needs to be manually executed by an operator, the length of time and the labor required for the recovery processing can be greatly reduced. In addition, by executing optimal salvage processing for each substrate left in the substrate processing apparatus in correspondence to the extent to which it has been processed at the time of the operation stop due to the abnormality, the maximum number of substrate can be salvaged.

BRIEF DESCRIPTION OF THE DRAWINGS

FIG. 3 presents a specific example of the wafer storage information in FIG. 2;

FIG. 4 presents a specific example of the wafer processing history information in FIG. 2;

DETAILED DESCRIPTION OF PREFERRED EMBODIMENT

Figure 1:
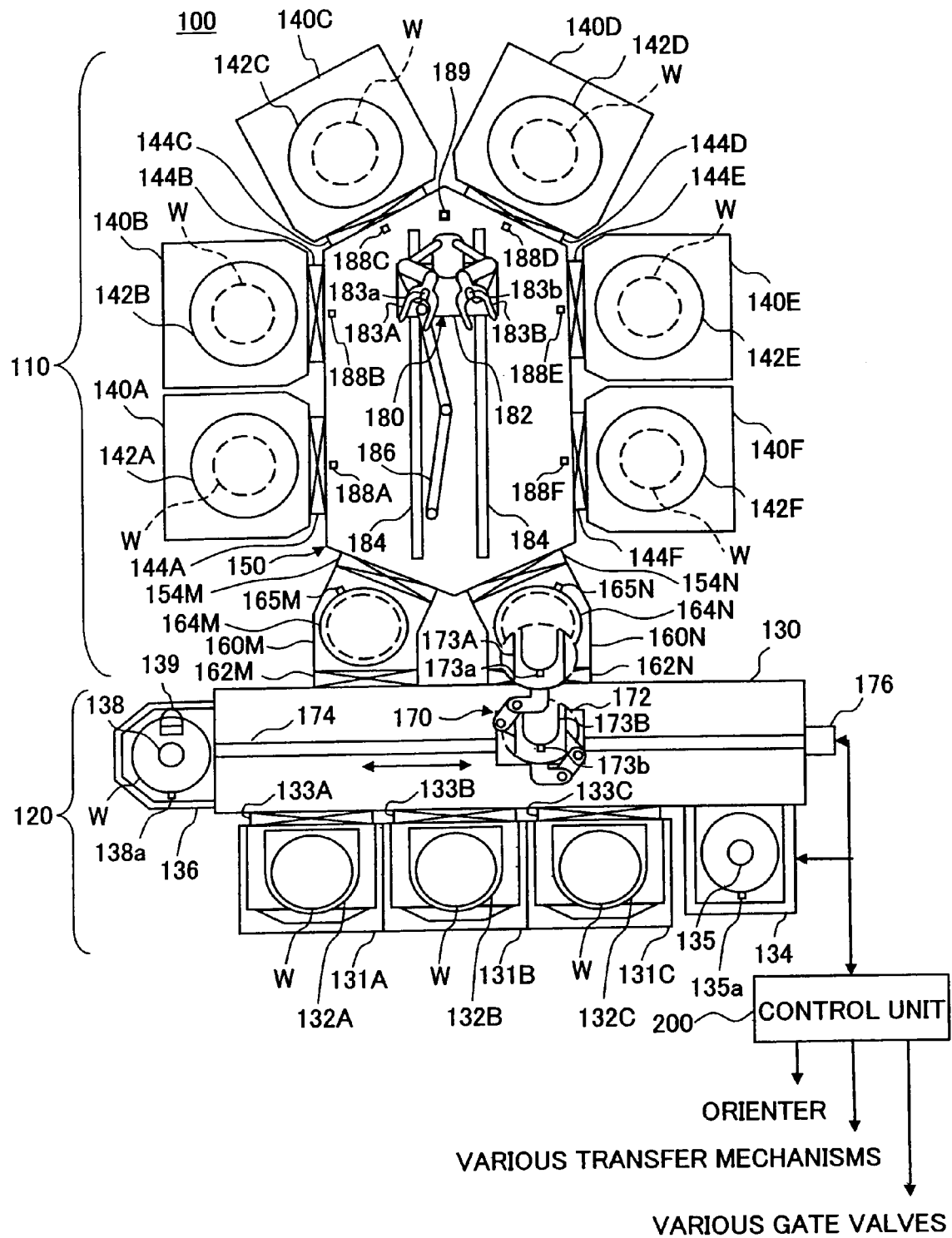
FIG. 1 is a sectional view showing the structure adopted in the substrate processing apparatus achieved in an embodiment of the present invention.

The following is a detailed explanation of a preferred embodiment of the present invention, given in reference to the attached drawings. It is to be noted that in the specification and the drawings, the same reference numerals are assigned to components having substantially identical functions and structural features to preclude the necessity for a repeated explanation thereof.

(Structural Example of Substrate Processing Apparatus)

First, the substrate processing apparatus achieved in an embodiment of the present invention is explained in reference to drawings. FIG. 1 schematically shows the structure adopted in the substrate processing apparatus in the embodiment of the present invention. The substrate processing apparatus 100 comprises a processing unit 110, which includes a plurality of processing chambers where various types of processing such as film formation and etching are executed on substrates, e.g., semiconductor wafers (hereafter may be simply referred to as "wafers") W, and a transfer unit 120 that transfers the wafers W to/from the processing unit 110.

First, an example of a structure that may be adopted in the transfer unit 120 is explained. As shown in FIG. 1, the transfer unit 120 includes a transfer chamber 130 through which wafers are transferred between substrate storage containers such as cassette containers 132 (132A through 132C) to be detailed later and the processing unit 110. The transfer chamber 130 is formed as a box with a substantially polygonal section. On one side of the transfer chamber 130 along the longer side of its substantially polygonal section, a plurality of cassette steps 131 (131A through 131C) are disposed side-by-side. The cassette containers 132A through 132C representing an example of substrate storage containers can be placed on the cassette steps 131A through 131C respectively.

The cassette containers 132 (132A through 132C) each has a capacity for holding up to, for instance, 25 wafers W stacked with uniform pitches. The cassette containers adopt a sealed structure with their inner space filled with, for instance, an $N_2$ gas atmosphere. The wafers W can be transferred between the transfer chamber 130 and the cassette containers via gate valves 133 (133A through 133C). It is to be noted that the numbers of the cassette steps 131 and the cassette containers 132 are not limited to those shown in FIG. 1.

In addition, a particle measurement chamber (particle monitor) 134 is disposed at a side surface of the transfer chamber 130. A stage 135 on which a wafer W is placed is disposed in the particle measurement chamber 134 where the quantity of particles of the substance having become adhered to the wafer W placed on the stage 135 is measured. It is to be noted that since the particle measurement chamber 134 can be achieved by adopting an internal structure of the known art, a detailed explanation of its internal structure is not provided. A wafer sensor 135a capable of detecting whether or not a wafer W is currently present on the stage 135 is disposed at the stage 135 in the particle measurement chamber 134. The wafer sensor 135a may be, for instance, a pickup sensor of the known art.

In such a particle measurement chamber 134, the quantity of particles on a wafer W undergoing the particle quantity measurement, which has been carried via, for instance, the transfer unit-side transfer mechanism 170 into the particle measurement chamber 134, is directly measured. A decision may be made as to whether or not the wafer W is fit for reprocessing based upon the results of the particle quantity measurement as well.

In addition, the quantities of particles inside the individual chambers such as the transfer unit 120, a common transfer chamber 150, load-lock chambers 160M and 160N and processing chambers 140A through 140F may each be measured by using a special wafer for particle measurement, instead of a wafer undergoing wafer processing. More specifically, assuming that wafers for the particle measurement are stored in the cassette container 132C, a particle measurement wafer in the cassette container 132C is first carried into a particle quantity measurement target chamber and a predetermined length of time is allowed to elapse. Once the predetermined length of time elapses, the particle measurement wafer is carried to the particle measurement chamber 134 where the quantity of particles deposited on the particle measurement wafer is measured.

A control unit 200 to be described in detailed later is connected to the particle measurement chamber 134 and thus, the results of the particle quantity measurement and the like are provided to the control unit 200 where the results are stored in the form of, for instance, a log into a storage means 290, a memory or the like within the control unit 200.

At an end of the transfer chamber 130, i.e., at a side surface along the shorter side of the substantially polygonal section of the transfer chamber 130, an orienter (pre-alignment stage) 136 to function as a positioning device, which includes a rotating stage 138 and an optical sensor 139 for optically detecting an edge of a wafer W disposed therein is present. The orienter 136 aligns the wafer W by detecting, for instance, an orientation flat, a notch or the like at the wafer W. A wafer sensor 138a capable of detecting whether or not a wafer W is currently present on the rotating stage 138 is disposed at the rotating stage. The wafer sensor 138a may be constituted with, for instance, a pickup sensor of the known art.

Inside the transfer chamber 130, a transfer unit-side transfer mechanism (transfer chamber internal transfer mechanism) 170 that transfers a wafer W along its longer side (along the direction indicated by the arrow in FIG. 1) is disposed. A base 172 at which the transfer unit-side transfer mechanism 170 is locked is slidably supported on a guide rail 174 extending over the central area inside the transfer chamber 130 along the lengthwise direction. A mover and a stator of a linear motor are respectively disposed at the base 172 and the guide rail 174. A linear motor drive mechanism 176 used to drive the linear motor is disposed at an end of the guide rail 174. The control unit 200 is connected to the linear motor drive mechanism 176. Thus, the linear motor drive mechanism 176 is driven in response to a control signal provided by the control unit 200 to move the transfer unit-side transfer mechanism 170 along the direction indicated by the arrow together with the base 172 on the guide rail 174.

The transfer unit-side transfer mechanism 170 is constituted with a double arm mechanism that includes two end-effectors 173A and 173B so as to allow it to handle two wafers at a time. Thus, when transferring a wafer to/from a cassette container 132, the orienter 136, or the load-lock chamber 160M or 160N, it is able to exchange wafers. Wafer sensors 173a and 173b, each capable of detecting whether or not a wafer W is currently held at the corresponding end-effector, are disposed at the end-effectors 173A and 173B of the transfer unit-side transfer mechanism 170. The wafer sensors 173a and 173b may each be constituted with a pickup sensor of the known art. It is to be noted that the number of end-effectors included in the transfer unit-side transfer mechanism 170 does not need to be two and a single arm mechanism with a single end-effector may be used instead.

Next, a structural example that may be adopted in the processing unit 110 is explained. If the substrate processing apparatus assumes a cluster tool structure, it's processing unit 110 may be achieved as shown in FIG. 1 by disposing a plurality of processing chambers 140 (first through sixth processing chambers 140A through 140F) where wafers W undergo specific types of processing such as film formation (e.g., plasma CVD processing) and etching (e.g., plasma etching) and the load-lock chambers 160M and 160N around the common transfer chamber 150 formed in a Polygonal (e.g., hexagonal) shape.

A single type of processing or different types of processing can be executed on the wafers W in the processing chambers 140A through 140F. Stages 142 (142A through 142F) on which the wafers W are to be placed are respectively disposed inside the processing chambers 140 (140A through 140F). It is to be noted that the number of processing chambers 140 is not limited to the example shown in FIG. 1.

In each of the processing chambers 140A through 140F, a wafer W undergoes a specific type of processing based upon wafer processing information such as a process recipe stored in advance at the storage means 290 of the control unit 200 or the like, which indicates the processing steps and the like. The contents of the wafer processing information vary in correspondence to the type of wafer processing to be executed and the processing conditions under which the wafer processing is to be executed. The wafer processing information based upon which a wafer W is, for instance, etched, may indicate processing steps such as those shown in FIG. 12.

The processing steps in FIG. 12 include a stabilizing step, an etching step (process step) and a terminating step. During the stabilizing step, the condition inside the processing chamber 140 is stabilized prior to execution of the etching process on the wafer W in the subsequent etching step. The stabilizing step may include, for instance, an evacuation step during which the processing chamber 140 is evacuated after the wafer W is placed on the stage 142, a processing gas supply step during which a specific type of processing gas is drawn in and a plasma generation step during which the processing gas is raised to plasma by applying a specific level of high-frequency power to an electrode such as a lower electrode functioning as the stage 142 and the state of the plasma is stabilized. During the etching step, the wafer is etched over a predetermined length of time by the plasma. During the terminating step, the condition inside the processing chamber 140 following the immediately preceding etching step is stabilized. The terminating step may include an ending step in which the etching process executed in the immediately preceding etching step is ended at an end point. It is to be noted that the processing steps executed on the wafer W are not limited to those in this example.

Wafers W are transferred via the common transfer chamber 150 between the individual processing chambers 140A through 140F or between the processing chambers 140A through 140F and the first and second load-lock chambers 160M and 160N. The common transfer chamber 150, which is formed in a polygonal shape (e.g., a hexagonal shape), is connected with the individual processing chambers 140 (140A through 140F) disposed around it via gate valves 144 (144A through 144F). The front ends of the first and second load-lock chambers 160M and 160N are also connected to the common transfer chamber 150 respectively via gate valves (vacuum pressure-side gate valves) 154M and 154N. The base ends of the first and second load-lock chambers 160M and 160N are connected to another side surface of the transfer chamber 130 along the longer side of its substantially polygonal section respectively via gate valves (atmospheric pressure-side gate valves) 162M and 162N.

Each of the load-lock chambers 160M and 160N has a function of temporarily holding a wafer W to be transferred to the next stage after pressure adjustment. Inside the first and second load-lock chambers 160M and 160N, transfer stages 164M and 164N on which wafers W can be placed are disposed. Wafer sensors 165M and 165N, each capable of detecting whether or not a wafer W is currently present on the corresponding transfer stage 164M or 164N, are respectively disposed at the transfer stages 164M and 164N. The wafer sensors 165M and 165N may each be constituted with, for instance, a pickup sensor of the known art.

The first and second load-lock chambers 160M and 160N adopt a structure that allows a purge of particles of residue and the like and evacuation thereof. More specifically, a discharge system that includes a vacuum pump such as a dry pump connected to a discharge pipe having a discharge valve (discharge control valve) disposed thereat and a gas supply system that includes a gas supply source connected to a gas supply pipe having a purge valve (purge gas control valve) disposed thereat are provided in conjunction with each of the first and second load-lock chambers 160M and 160N. By controlling the purge valves, the discharge valves and the like, cleaning processing during which the load-lock chambers are evacuated and then charged repeatedly while drawing in the purge gas and discharge processing are executed.

It is to be noted that the common transfer chamber 150 and the processing chambers 140A through 140F, too, each adopt a structure that allows a purge of particles of residue and the like and evacuation. For instance, at the common transfer chamber 150, a gas supply system through which a purge gas is drawn in as described earlier and a discharge system capable of evacuation are disposed, whereas a gas supply system through which a processing gas as well as a purge gas can be drawn in and a discharge system capable of evacuation are provided in conjunction with each of the processing chambers 140A through 140F.

At the processing unit 110 structured as described above, the passages between the common transfer chamber 150 and the individual processing chambers 140A through 140F and the passages between the common transfer chamber 150 and the individual load-lock chambers 160M and 160N can be opened/closed while assuring a high level of airtightness, thereby achieving a cluster tool structure that allows communication with the common transfer chamber 150 as necessary. In addition, the passages between the transfer chamber 130 and the first and second load-lock chambers 160M and 160N, too, can be opened/closed while assuring airtightness.

Inside the common transfer chamber 150, a processing unit-side transfer mechanism (common transfer chamber internal transfer mechanism) 180 constituted with an articulated arm capable of extending/retracting, moving up/down and rotating, for instance, is disposed. The processing unit-side transfer mechanism 180 is rotatably supported at a base 182. The base 182 is allowed to slide freely over guide rails 184 disposed from the base end side toward the front end side inside the common transfer chamber 150 via, for instance, an arm mechanism 186. The load-lock chambers 160M and 160N and the processing chambers 140A through 140F can be accessed by the processing unit-side transfer mechanism 180 as it sides along the guide rails 184.

For instance, to access the load-lock chamber 160M or 160N or either of the processing chambers 140A and 140F located at positions facing opposite each other, the processing unit-side transfer mechanism 180 is positioned on the guide rails 184 toward the base end of the common transfer chamber 150. To access any of the four processing chambers 140B through 140E, the processing unit-side transfer mechanism 180 is positioned on the guide rails 184 toward the front end of the common transfer chamber 150. Thus, all the chambers connected to the common transfer chamber 150, i.e., the load-lock chambers 160M and 160N and the individual processing chambers 140A through 140F, can be accessed by a single processing unit-side transfer mechanism 180. The processing unit-side transfer mechanism 180 includes two end-effectors 183A and 183B and thus is capable of handling two wafers W at a time. Wafer sensors 183a and 183b, each capable of detecting whether or not a wafer W is currently held at the corresponding end-effector 183A or 183B are respectively disposed at the end-effectors 183A and 183B of the processing unit-side transfer mechanism 180. The wafer sensors 183a and 183b may each be constituted with, for instance, a pickup sensor of the known art.

It is to be noted that the processing unit-side transfer mechanism 180 may adopt a structure other than that described above, and may include, for instance, two transfer mechanisms. Namely, a first transfer mechanism constituted with an articulated arm capable of extending/retracting, moving up/down and rotating may be disposed toward the base end of the common transfer chamber 150 and a second transfer mechanism constituted with an articulated arm capable of extending/retracting, moving up/down and rotating may be disposed toward the front end of the common transfer chamber 150. In addition, the number of end-effectors at the processing unit-side transfer mechanism 180 does not need to be two, and the processing unit-side transfer mechanism 180 may include, for instance, a single end-effector, instead.

Wafer sensors 188 (188A through 188F), each capable of detecting whether or not a wafer W has been carried into/out of the corresponding processing chamber 140 (among the processing chambers 140A through 140F), are disposed inside the common transfer chamber 150 at positions preceding the gate valves 144 (144A through 144F) disposed in conjunction with the individual processing chambers 140 (140A through 140F). In addition, toward the front end of the common transfer chamber 150, a position sensor 189 to be used to correct the position of a wafer W transferred via the processing unit-side transfer mechanism 180 is disposed. It is to be noted that the positional correction for the wafer W is to be described in detail later in reference to a specific example. The wafer sensors 188A through 188F and the position sensor 189 may each be constituted with, for instance, a pickup sensor of the known art.

The substrate processing apparatus 100 includes the control unit 200 that controls the overall operations of the substrate processing apparatus, including control of the transfer unit-side transfer mechanism 170, the processing unit-side transfer mechanism 180, the gate valves 133, 144, 154 and 162, the orienter 136, the particle measurement chamber 134 and the like.

(Structural Example of Control Unit)

Figure 2:
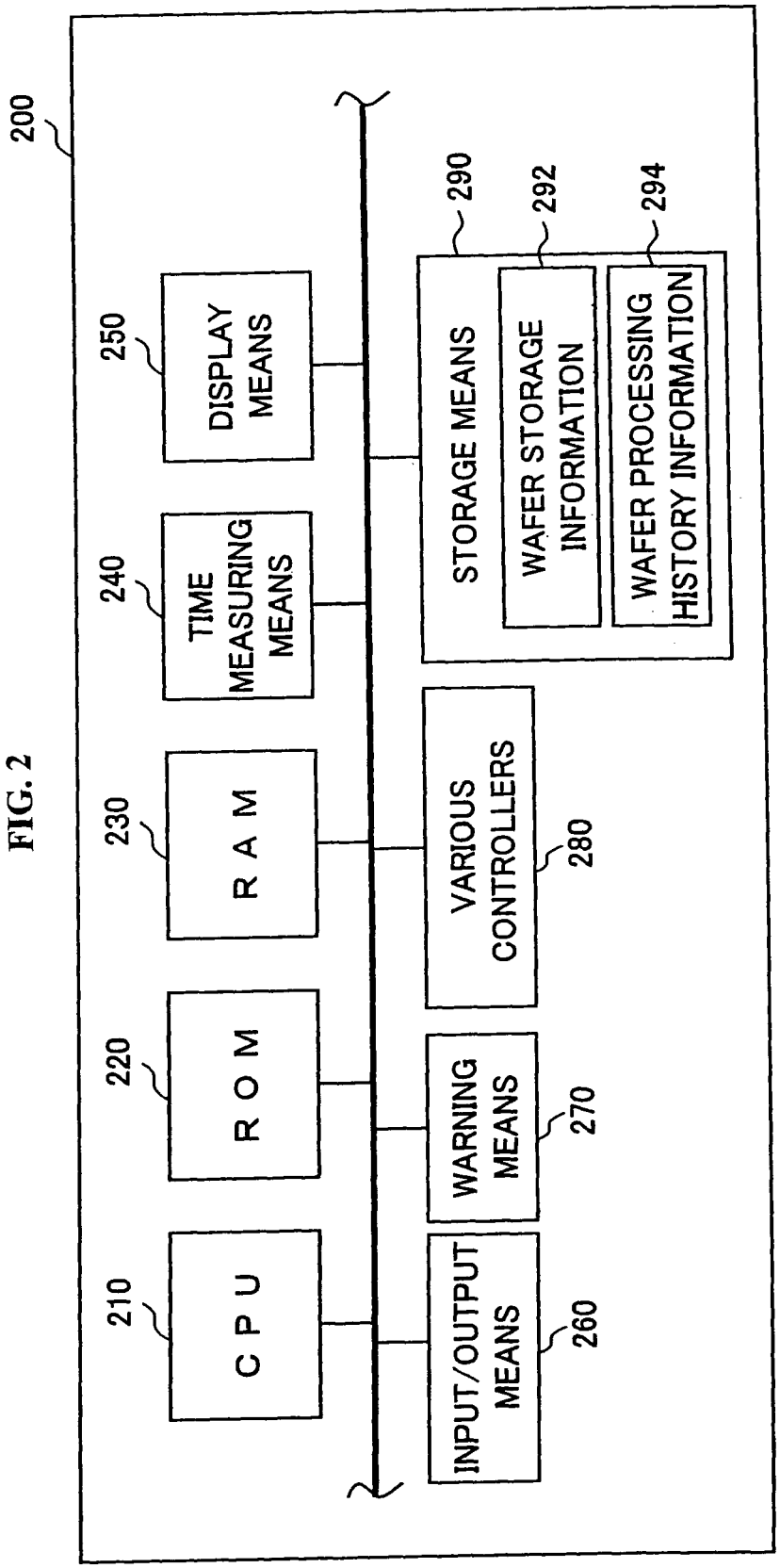
FIG. 2 is a block diagram of a structural example that may be adopted in the control unit in FIG. 1.

Now, a specific example of a structure that may be adopted in the control unit 200 is explained in reference to a drawing. FIG. 2 is a block diagram presenting a specific structural example that may be adopted in the control unit 200. The control unit 200 in FIG. 2 comprises a CPU (central processing unit) 210 constituting the control unit main body, a ROM (read only memory) 220 having stored therein program data (e.g., program data used to execute processing on wafers W and recovery processing) based upon which the CPU 210 controls the various units, a RAM (random access memory) 230 that includes a memory area used by the CPU 210 when it executes various types of data processing, a time measuring means 240 constituted with a counter or the like used to measure lengths of time, a display means 250 constituted with a liquid crystal display or the like at which an operation screen or a selection screen is brought up on display, an input/output means 260 through which an operator is able to input various types of data such as process recipes and edit data and a various types of data such as process recipes and process logs to a specific storage medium, a warning means 270 constituted with, for instance, an alarm such as a buzzer for providing a warning in the event of an abnormality such as an electrical leak at the substrate processing apparatus 100, various controllers 280 used to control the various units constituting the substrate processing apparatus 100 and the storage means 290 constituted with, for instance, a hard disk (HDD).

The CPU 210, the ROM 220, the RAM 230, the time measuring means 240, the display means 250, the input/output means 260, the warning means 270, the various controllers 280 and the storage means 290 are electrically connected via a bus line such as a control bus, a system bus or a data bus.

In the storage means 290, wafer storage information 292 indicating whether or not a specific wafer W is currently stored in a cassette container 132 (among the cassette containers 132A through 132C), wafer processing history information (e.g., process logs) 294 indicating the processing stage each wafer W is at and the like are stored.

A specific example of the wafer storage information 292 is now explained in reference to FIG. 3. The wafer storage information 292 includes entries such as "container name", "serial number", "wafer ID", "wafer storage status", "recovery processing" and "wafer processing status", as shown in FIG. 3. The data entered as the "container name" are used to identify a specific cassette container, since the wafer storage information 292 is stored in correspondence to each cassette container. In the case of the substrate processing apparatus 100 shown in FIG. 1, for instance, the data indicate one of the cassette containers 132A through 132C.

The data entered as the "serial number" are used to identify the specific position of the rack at which the wafer is stored inside the cassette container 132 where wafers W are stored individually one at a time. For instance, assuming that up to 25 wafers W are stored in a given cassette container 132, a value from 1 to 25 is indicated as the serial number. The data in the "wafer ID" indicate the wafer ID of the subject wafer W stored at a given slot inside the cassette container 132. The term "wafer ID" in this context refers to an ID designated to each wafer by the operator prior to the processing of the wafers W. The wafer IDs may be set by the operator by, for instance, performing a specific operation via the input/output means 260 with regard to the wafers W stored in the cassette container 132 prior to the processing. The data entered as the "wafer storage status" indicate whether or not the subject wafer W is stored at the corresponding wafer storage rack in the cassette container 132. In the example presented in FIG. 3, "yes" indicates that the wafer W is stored in the container, whereas "no" indicates the wafer W is not stored in the cassette container.

The data entered as the "recovery processing" indicate whether or not the subject wafer W in the cassette container 132 has undergone the recovery processing to be detailed later. The term "recovery processing" in this context refers to processing executed to restore the state of the substrate processing apparatus 100 after the operation of the substrate processing apparatus 100 has been stopped due to an abnormality such as an electrical leak and then the abnormality has been corrected. In the example presented in FIG. 3, "yes" indicates that the subject wafer W has undergone the recovery processing, whereas "no" indicates that the wafer W has not undergone the recovery processing. The data entered as the "wafer processing status" indicate the current processing status (processing stage) of the subject wafer W in the cassette container 132. In the example presented in FIG. 3, "processing complete" indicates that the wafer W has undergone all the necessary processing, whereas "unprocessed" indicates that the wafer W has not undergone any of the necessary processing. "Recovery processing in progress" indicates that the recovery processing is currently underway for the wafer W.

Based upon such wafer storage information 292, the recovery processing status of each wafer W, i.e., whether or not it has undergone the recovery processing, and the processing status of the wafer W, as well as the storage status indicating whether or not the wafer W is currently stored at a cassette container 132, can be ascertained. In addition, the wafer storage information 292 may be brought up on display at the display means 250 in response to an operation of the input/output means 260 by the operator so as to allow the operator to view the wafer storage information. In such a case, each wafer W having undergone the recovery processing may be shaded and a wafer W currently undergoing the recovery processing may be indicated with denser shading, as shown in FIG. 3, so as to enable a quick review of the information. The display will allow the operator to ascertain the recovery processing status of each wafer W with ease, and based upon the recovery processing status, the subsequent inspection of the wafer W and the like can be executed efficiently, for instance.

It is to be noted that the data entries of the wafer storage information 292 are not limited to those shown in FIG. 3, and the wafer storage information may contain more diverse data entries, or it does not need to include the "recovery processing" and the "wafer processing status" as long as the wafer storage status, at least, can be ascertained based upon the wafer storage information.

Next, a specific example of the wafer processing history information 294 is explained in reference to FIG. 4. As shown in FIG. 4, the wafer processing history information 294 contain data in entries such as "container name", "serial number", "wafer ID", "processing number", "wafer processing stage" and "elapsed time". The data in the "container name", "serial number" and "wafer ID" entries are similar to those in FIG. 3, and accordingly, a detailed explanation thereof is not provided.

The data in the "processing number" indicate numbers assigned to various steps of processing executed on the wafer W. The data in the "wafer processing stage" indicate the steps of processing that the wafer W has undergone. The data in the "elapsed time" provide time information in correspondence to the individual processing steps. In the example presented in FIG. 4, the data indicate the processing start time (START-TIME) at which the wafer processing was started, the time points (IN) at which the wafer W was carried into the individual chambers and the time points (OUT) at which the wafer W was carried out of the individual chambers. In addition, if the operation of the substrate processing apparatus 100 was stopped during a processing stage, the operation stop time (STOPTIME) is also indicated. The data in the example presented in FIG. 4 indicate that the operation of the substrate processing apparatus 100 was stopped while the etching step was in progress in the first processing chamber 140A.

It is to be noted that the contents of the wafer processing history information 294 are determined based upon, for instance, the wafer detection results provided by the wafer sensors 135a, 138a, 165M, 165N and 188A through 188F disposed in conjunction with the individual chambers and the wafer sensors 173a, 173b, 183a and 183b disposed in conjunction with the transfer mechanisms 170 and 180, the wafer processing information such as the process recipes, the lengths of time measured by the time measuring means 240 and the like. For instance, the time points at which the wafer W was carried into/out of the orienter 136 are determined based upon the time point at which the wafer W was detected by the wafer sensor 138a. In addition, the time points at which the wafer W was carried into/out of the load-lock chambers 160M and 160N are determined based upon the time points at which the wafer W was detected by the wafer sensors 165M and 165N. The time points at which the wafer W was carried into/out of the first through sixth processing chambers 140A through 140F are determined based upon the time points at which the wafer W was detected by the wafer sensors 188A through 188F.

Through such wafer processing history information 294, location information and processing stage information indicating the location and processing stage of the subject wafer W at the time of an operation stop at the substrate processing apparatus 100, as well as location information indicating the specific chamber where the wafer W is present and time information related to the processing steps, can be obtained. In addition, by including information indicating the processing stage of the subject wafer undergoing the recovery processing in the wafer processing history information 294, a specific processing stage to which the recovery processing has progressed, too, can be ascertained.

In addition, the wafer processing history information 294 may be brought up on display at the display means 250 in response to an operation of the input/output means 260 by the operator so as to allow the operator to view the wafer processing history information 294. It is to be noted that the data entries of the wafer processing history information 294 are not limited to those shown in FIG. 4.

Information needed to engage the substrate processing apparatus 100 in operation to process wafers W, in addition to the wafer storage information 292 and the wafer processing history information 294 described above, is stored into the storage means 290. For instance, particle measurement result information indicating the results of the measurement executed in the particle measurement chamber 134 and wafer processing information such as the process recipes based upon which wafers W are processed in the individual processing chambers 140 (140A through 140F) are also stored in the storage means 290. The CPU 210 at the control unit 200 controls the processing executed on wafers W in the processing chambers 140A through 140F based upon the wafer processing information stored in the storage means 290.

(Operations of Substrate Processing Apparatus)

Next, the operations of the substrate processing apparatus structured as described above are explained. The substrate processing apparatus 100 is engaged in operation in conformance to a program executed by the CPU 210 of the control unit 200, and the wafer processing history information (e.g., process logs) 294, generated as wafers W undergo individual processing steps, is stored into the storage means 290.

A wafer W transferred from one of the cassette container 132A through 132C by the transfer unit-side transfer mechanism 170 is carried to the orienter 136 where it is placed on the rotating stage 138 for alignment. The aligned wafer W is then transferred out of the orienter 136 and is carried into the load-lock chamber 160M or 160N. If a processing complete wafer having undergone all the necessary processing is present in the load-lock chamber 160M or 160N at this time, the processing complete wafer W is first taken out and then the unprocessed wafer W is carried into the load-lock chamber.

The wafer W having been carried into the load-lock chamber 160M or 160N is transferred out of the load-lock chamber 160M or 160N by the processing unit-side transfer mechanism 180 and is carried into the processing chamber 140 where it is to undergo a specific type of processing. Once the processing is completed in the processing chamber 140, the processed wafer W is carried out of the processing chamber 140 by the processing unit-side transfer mechanism 180. If the wafer W needs to undergo continuous processing over a plurality of processing chambers 140, the wafer W is carried into another processing chamber 140 where it is to undergo subsequent processing.

The processing complete wafer, having undergone all the necessary processing, is then carried back into the load-lock chamber 160M or 160N. The processed wafer W having been carried back into the load-lock chamber 160M or 160N is then taken back to the initial cassette container among the cassette containers 132A through 132C via the transfer unit-side transfer mechanism 170.

Since the throughput of the processing in each processing chamber 140 can be improved by keeping an unprocessed wafer W waiting in standby at the closest possible position to the processing chamber 140, unprocessed wafers are continuously transferred out of the cassette container 132 even while the processing in the processing chamber 140 is in progress, and these unprocessed wafers are made to wait in standby at the common transfer chamber 150, the load-lock chamber 160M or 160N, the orienter 136 and the like. Once the processing of a given wafer in the processing chamber 140 is completed, the processed wafer is immediately returned to the initial cassette container 132, the unprocessed wafers waiting in standby are sequentially advanced and the next unprocessed wafer to undergo the processing, which has been waiting in standby in the common transfer chamber 150, is immediately carried into the processing chamber 140.

If an abnormality such as a malfunction of the substrate processing apparatus 100, a power interruption or an electrical leak occurs while the substrate processing apparatus 100 is engaged in operation, the operation of the substrate processing apparatus 100 is stopped by, for instance, cutting off the power to the substrate processing apparatus 100. As the operation of the substrate processing apparatus 100 stops, the wafer processing having been in progress in the individual processing chambers 140A through 140F is halted and the wafers undergoing the processing are left in the processing chambers 140A through 140F. In addition, wafers W waiting in standby in the transfer unit 120 (e.g., inside the transfer chamber 130, the orienter 136 and the particle measurement chamber 134) in the processing unit 110 (e.g., inside the common transfer chamber 150, and the load-lock chambers 160M and 160N) and the like are also left inside the chambers.

In the substrate processing apparatus 100 achieved in the embodiment, the recovery processing described below is automatically executed as the power to the substrate processing apparatus 100 is turned on again after the operation of the substrate processing apparatus 100 has been stopped due to an occurrence of an abnormality and subsequently the abnormality has been corrected.

(Recovery Processing)

The recovery processing executed in the substrate processing apparatus 100 is now explained. The recovery processing for the substrate processing apparatus 100 may be executed by, for instance, the CPU 210 of the control unit 200 based upon a program stored in the ROM 220, the storage means 290 or the like.

The recovery processing in the embodiment is primarily constituted with substrate retrieval processing (a substrate retrieval step) through which a wafer W is retrieved into the cassette container 132 after executing a specific type of wafer salvage processing (substrate salvage processing) and apparatus internal state restoration processing (an apparatus internal state restoration step) through which the states inside the individual chambers of the substrate processing apparatus 100 are restored. The specific phases of the recovery processing are now individually explained.

(Substrate Retrieval Processing Executed During Recovery Processing)

First, the substrate retrieval processing is explained. In the substrate retrieval processing, each wafer W left in a chamber of the substrate processing apparatus 100 undergoes wafer salvage processing (substrate salvage processing) corresponding to the extent to which it has been processed at the time of the operation stop (hereafter may be simply referred to as the operation stop) of the substrate processing apparatus 100, and the wafer W having undergone the wafer salvage processing is then retrieved into the initial cassette container 132. For instance, the wafer W left in the substrate processing apparatus 100 may undergo salvage processing corresponding to the chamber in which it was left at the time of the operation stop. Generally speaking, the processing stage of the wafer W, i.e., the extent to which the wafer W has been processed at the time of the operation stop, is in direct correlation to the chamber in which it is left. For instance, a wafer W left in the transfer unit 120 is either an unprocessed wafer having been taken out of the cassette container 132 to be transferred into the processing unit or a wafer in a processing complete state having undergone all the necessary processing and having been carried back from the processing unit 110. A wafer W left in the common transfer chamber 150, on the other hand, may be an unprocessed wafer, a wafer in a processing complete state or a wafer in a processing incomplete state which needs to undergo further processing in another processing chamber. Accordingly, optimal salvage processing matching the processing stage of each wafer W can be executed in correspondence to the specific chamber where the wafer W is left.

Any wafer W left in, for instance, the transfer unit 120 (e.g., inside the transfer chamber 130, the orienter 136 or the particle measurement chamber 134) can be assumed to be either an unprocessed wafer W that has not been processed at all or a wafer W in a processing complete state having undergone all the necessary processing, as explained earlier and, accordingly, it can be retrieved into the initial cassette container 132 without resulting in a problem. Accordingly, wafers W left in the transfer unit 120 are basically directly retrieved into the initial cassette container 132 in the wafer salvage processing.

Wafers W left in the processing unit 110 (e.g., inside the processing chambers 140A through 140F, the common transfer chamber 150, the load-lock chambers 160M and 160N), on the other hand, may include a wafer yet to undergo further processing as well as wafers in an unprocessed state and a processing complete state, as explained earlier. For instance, a wafer W, the processing of which, such as etching, has been halted while underway (a processing-in-progress wafer), may be left in a processing chamber 140. In addition, inside the common transfer chamber 150, a wafer W in a processing incomplete state, which needs to undergo processing at a plurality of processing chambers 140 and is yet to undergo further processing in other processing chambers (processing incomplete wafer) may be left. For instance, the operation of the substrate processing apparatus 100 may have stopped when a wafer W needing to be processed continuously in the first through sixth processing chambers 140A through 140F had only undergone the processing in the first through fifth processing chambers 140A through 140E, had been carried out of the processing chamber 140E and had been waiting in the common transfer chamber 150 in standby for the processing in the last processing chamber, i.e., the sixth processing chamber 140F.

If a processing-in-progress wafer W or a processing incomplete wafer W were also retrieved into the cassette container 132, the retrieved wafer W may become unsalvageable. For instance, if the wafer having been undergoing polysilicon etching when the processing was halted were retrieved into the initial cassette container 132 and became exposed to the outside atmosphere, the wafer W would no longer be fit to undergo the remaining processing (e.g., the remaining etching process) and, in such a case, the wafer could no longer be salvaged. Accordingly, such a wafer W left in the processing unit 110, in principle, first undergoes the remaining processing and is then retrieved into the initial cassette container 132 once the processing is completed.

It is to be noted that the stabilizing step is first executed to stabilize the condition inside the processing chamber 140 before executing the remaining processing for the wafer W. For instance, before executing the remaining etching process for a wafer W left in a processing chamber 140, the processing chamber 140 first undergoes discharge processing and is then evacuated to set the pressure inside the processing chamber 140 to a predetermined level. Subsequently, the processing gas is drawn into the processing chamber and is then raised to plasma by applying high-frequency power. In the discharge processing in the processing chamber 140, a cycle purge, during which a cycle made up of charging while drawing in a purge gas such as $N_2$ or an inert gas and evacuation is repeated a predetermined number of times, may be executed. If a corrosive gas (e.g., chlorine or hydrogen chloride) is used as the processing gas, a cycle purge during which a diluent gas such as $N_2$ is drawn in may be executed as an acid discharge processing.

As described above, when the operation of the substrate processing apparatus is stopped due to an abnormality such as an electrical leak, the salvage processing is executed for wafers W in correspondence to the chambers where the individual wafers are left in the substrate processing apparatus 100 in the embodiment. Namely, the salvage processing is executed in correspondence to the processing steps of the individual wafers W, thereby ensuring that the wafers W are salvaged in an optimal manner. It is desirable to execute the substrate salvage processing starting with the wafer W left in the chamber closest to the initial cassette container 132. For instance, it is desirable to execute the salvage processing for wafers W in the order of; the transfer unit 120->the load-lock chambers 160->the common transfer chamber 150->the processing chambers 140. By executing the salvage processing in this order, the wafers W can be retrieved smoothly, which achieves better efficiency in the recovery processing.

When executing the substrate salvage processing, it is necessary to detect whether or not wafers W are left inside the individual chambers (e.g., the transfer unit 120, the load-lock chambers 160, the common transfer chamber 150 and the processing chambers 140). The presence of wafers may be detected by ascertaining the specific chambers in the processing unit 110 and the transfer unit 120 where wafers W are left based upon the wafer processing steps indicated in the wafer processing history information 294 such as that shown in FIG. 4.

Alternatively, the presence of wafers W in the particle measurement chamber 134, the orienter 136 and the transfer chamber 130 of the transfer unit 120 may be detected by the wafer sensors 135a and 138a disposed in the individual chambers and the wafer sensors 173a and 173b at the transfer unit-side transfer mechanism 170. In addition, the presence of wafers W in the load-lock chambers 160M and 160N and the common transfer chamber 150 at the processing unit 110 may be detected by the wafer sensors 165M and 165N disposed at the individual chambers and the wafer sensors 183a and 183b of the processing unit-side transfer mechanism 180.

The presence of wafers W may instead be detected by executing wafer transfer operations via the transfer unit-side transfer mechanism 170 and the processing unit-side transfer mechanism 180. For instance, the presence of wafers W left in the processing chambers 140A through 140F may be detected via the wafer sensors 188A through 188F disposed at the common transfer chamber in correspondence to the individual chambers and the wafer sensors 183a and 183b at the processing unit-side transfer mechanism 180 by engaging the processing unit-side transfer mechanism 180 in wafer transfer operation.

(Apparatus Internal State Restoration Processing Executed as Part of Recovery Processing)

Next, the apparatus internal state restoration processing executed as part of the recovery processing is explained. As the apparatus internal state restoration processing, cleaning processing may be executed inside the transfer unit 120, the common transfer chamber 150, the load-lock chambers 160M and 160N, the processing chambers 140A through 140F and the like to set the individual chambers in a wafer processing enabled state. The chambers may be cleaned by repeatedly executing a cycle constituted with evacuation and charging (e.g., NPPC: non-plasma particle cleaning) to switch between a vacuum and atmospheric pressure a predetermined number of times while drawing in a purge gas such as $N_2$. During such cleaning processing, the purge gas should be continuously drawn in while the subject chamber is being evacuated as well as while it is charged. Through such cleaning processing, particles (e.g., deposits, dust and dirt) suspended inside the chamber can be removed. In addition, by repeatedly alternating the evacuation and charging, particles deposited on the wall surfaces at the chamber and parts disposed inside the chamber, too, can be peeled off and forcibly lifted to facilitate the removal thereof.

It is to be noted that the chambers in the substrate processing apparatus 100 may be cleaned through processing other than that described above, and another type of cleaning processing of the unknown art may be executed instead. For instance, cleaning processing may be executed by using plasma.

(Specific Example of Recovery Processing)

Figure 5:
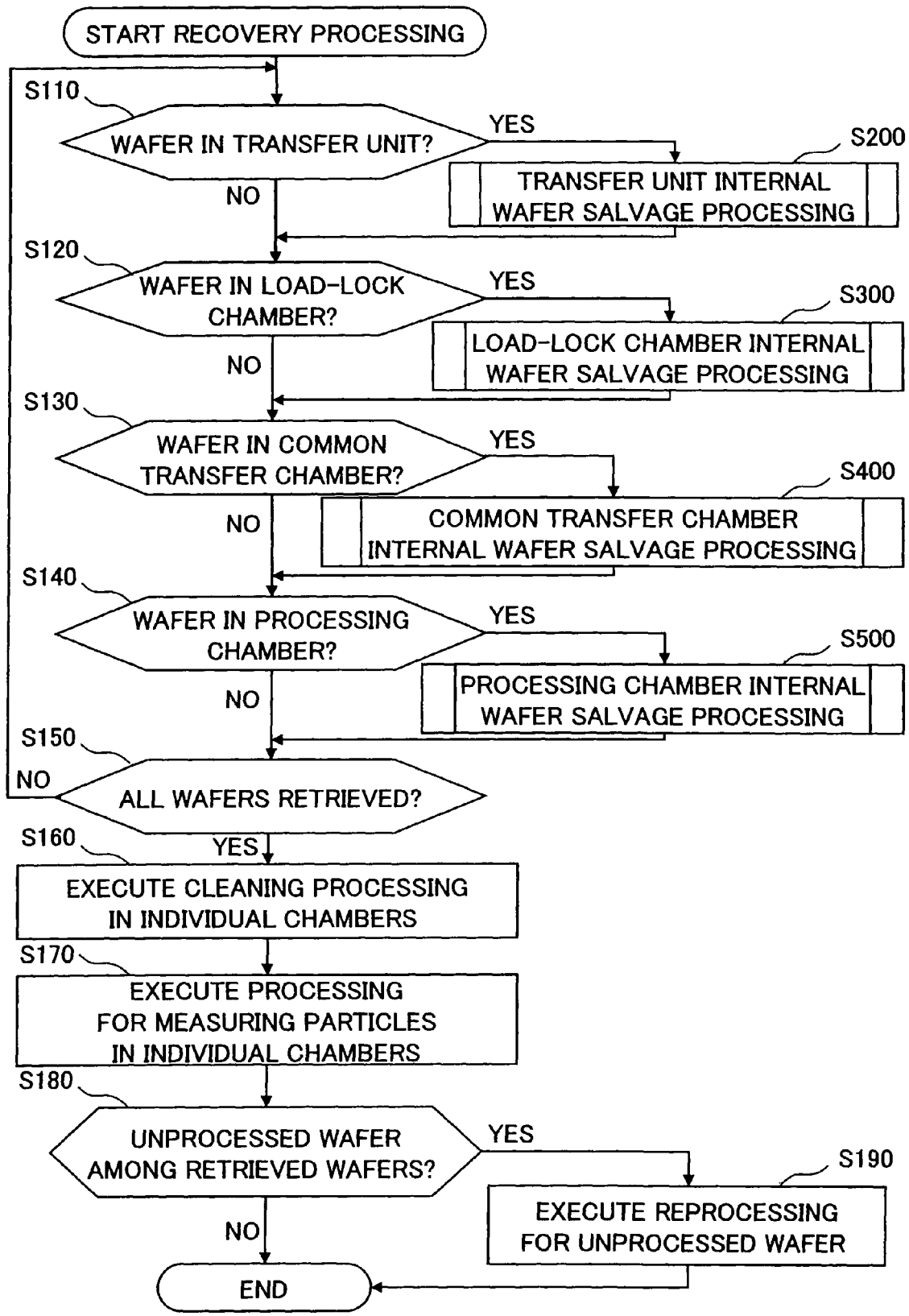
FIG. 5 presents a flowchart of a specific example of the recovery processing executed in the embodiment.

The following is a more detailed explanation of the recovery processing, given in reference to a specific example. FIG. 5 presents a flowchart of a main routine representing a specific example of the recovery processing executed for the substrate processing apparatus in the embodiment.

In the recovery processing in FIG. 5, wafer salvage processing (substrate salvage processing) is executed for wafers W in steps S110 through S150 and steps S200 through S500 in correspondence to the specific chambers where the wafers W are left, as part of the substrate retrieval processing before the wafers W left in the individual chambers are retrieved into the initial cassette container 132. Namely, transfer unit internal substrate salvage processing is executed in step S200 to salvage any wafer determined in step S110 to be left in the transfer unit 120. Also, the processing unit internal substrate salvage processing is executed by salvaging any wafer W determined in step S120 to be left in either load-lock chamber 160 (load-lock chamber internal substrate salvage processing) in step S300, by salvaging any wafer W determined in step S130 to be left in the common transfer chamber 150 (common transfer chamber internal substrate salvage processing) in step S400, and by salvaging any wafer W determined in step S140 to be left in a processing chamber 140 (processing chamber internal substrate salvage processing) in step S500. The following is an explanation of a specific example of such wafer salvage processing.

(Transfer Unit Internal Wafer Salvage Processing)

Figure 6:
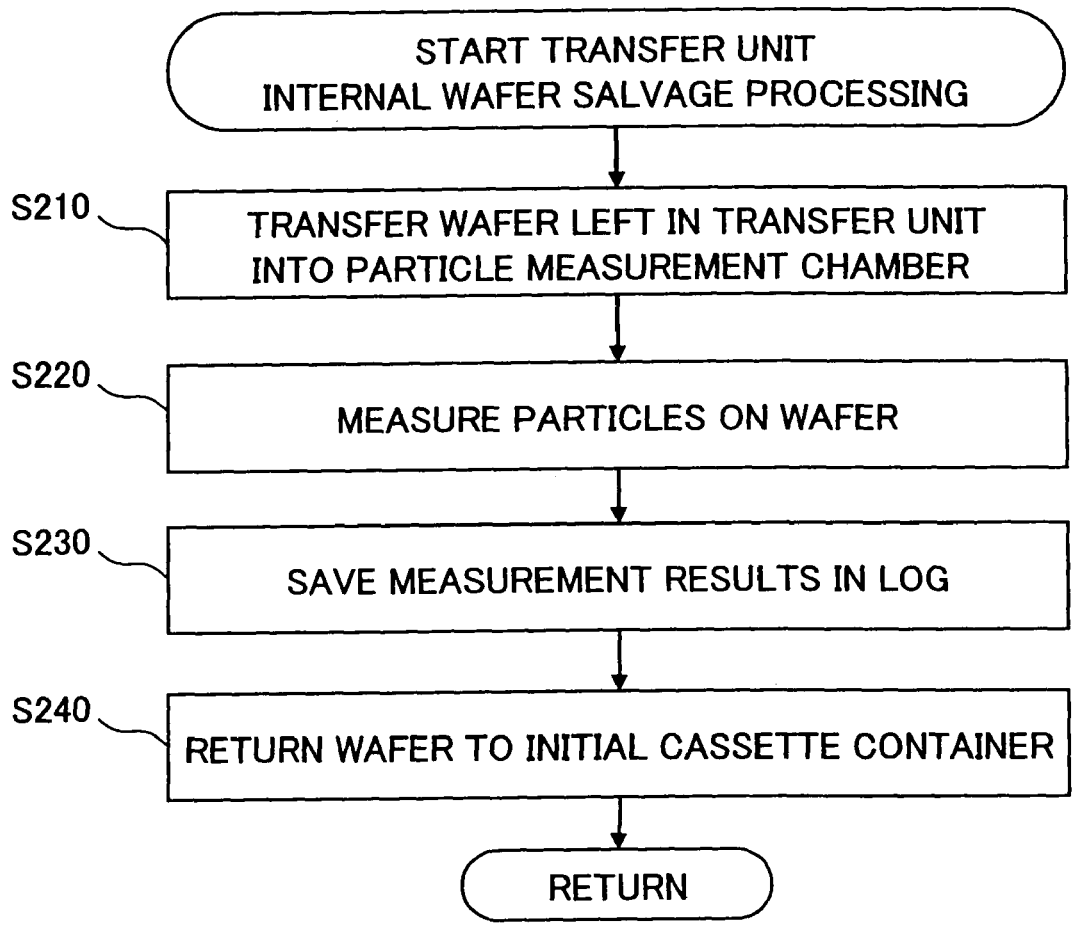
FIG. 6 presents a flowchart of a specific example of the transfer unit internal wafer salvage processing in FIG. 5.

First, in reference to FIG. 6, a specific example of the transfer unit internal wafer salvage processing (step S200) is explained. FIG. 6 presents a flowchart of a subroutine through which the transfer unit internal wafer salvage processing is executed to salvage wafers left in the transfer unit. Wafers W left in the transfer unit 120 may include wafers W left in the orienter 136 and the particle measurement chamber 134 as well as a wafer W left in the transfer chamber 130 still held at the transfer unit-side transfer mechanism 170. Accordingly, these wafers W are the targets of the wafer salvage processing in the transfer unit 120.

In the transfer unit internal wafer salvage processing shown in FIG. 6, a wafer W left in the transfer unit 120 is first transferred into the particle measurement chamber 134 via, for instance, the transfer unit-side transfer mechanism 170 in step S210. At this time, if the wafer W is present inside the transfer chamber 130, i.e., on an end-effector of the transfer unit-side transfer mechanism 170, it is directly transferred into the particle measurement chamber 134. If the wafer W is present inside the orienter 136, it is first carried out of the orienter 136 and is then transferred into the particle measurement chamber 134 by the transfer unit-side transfer mechanism 170. In this situation, if there is already a wafer W present in the particle measurement chamber 134, particle measurement is first executed for the preceding wafer W and the wafer W having undergone the measurement is then returned to the cassette container 132 where it was initially stored.

Next, in step S220, the quantity of particles deposited on the wafer W having been carried into the particle measurement chamber 134 is measured (particle measurement), and then the measurement results are stored as a particle measurement result information log into, for instance, the storage means 290 of the control unit 200 in step S230. In step S240, the wafer W is carried out of the particle measurement chamber 134 and is carried back into the initial cassette container 132 via the transfer unit-side transfer mechanism 170. As the sequence of the wafer salvage processing in the transfer unit 120 is completed, the operation returns to the main routine in FIG. 5.

Through the wafer salvage processing in the transfer unit 120 executed as described above, all wafers W left in the transfer unit 120 are retrieved into the initial cassette container 132 after the particle measurement. The wafers W left in the transfer unit 120 are all directly retrieved, since such wafers W are each either an unprocessed wafer or a wafer in a processing complete state having undergone all the necessary processing. Accordingly, since each wafer detected in the transfer unit 120 in the wafer salvage processing in the transfer unit 120 can be assumed to be either unprocessed or in a processing complete state, it is not strictly necessary in the transfer unit internal wafer salvage processing to detect the processing stage of the wafer W by checking, for instance, the wafer processing history information 294.

In addition, each wafer W left in the transfer unit 120 first undergoes the particle measurement, the results of which are then stored into a log or the like, before it is retrieved into the cassette container 132. Thus, a decision as to whether or not the wafer W having been retrieved into the cassette container 132 is fit for reprocessing can be made based upon the particle quantity measurement results.

(Load-Lock Chamber Internal Wafer Salvage Processing)

Figure 7:
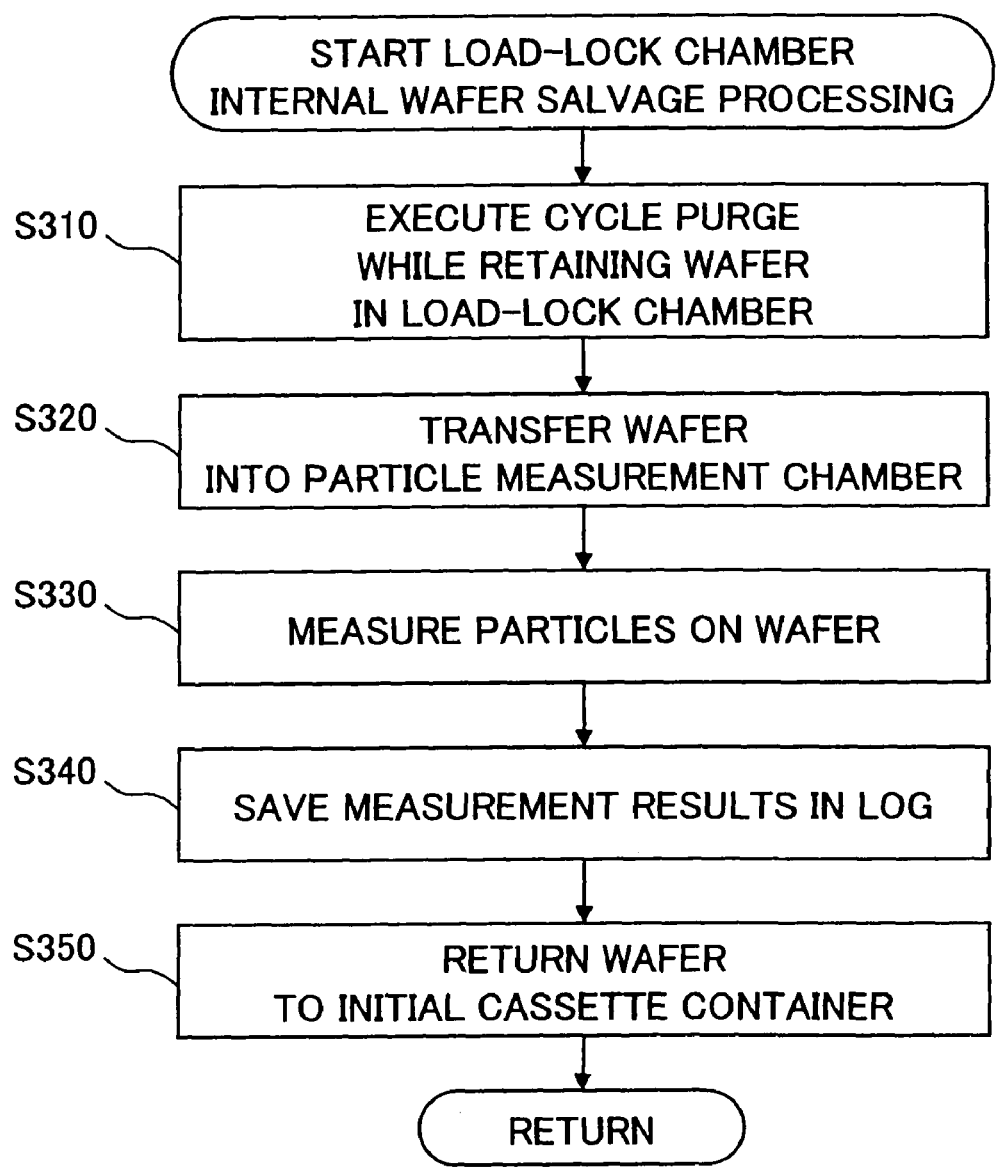
FIG. 7 presents a flowchart of a specific example of the load-lock chamber internal wafer salvage processing in FIG. 5.

Next, in reference to FIG. 7, a specific example of the wafer salvage processing for wafers left in the load-lock chambers 160 (executed in step S300) is explained. FIG. 7 presents a flowchart of the wafer salvage processing subroutine executed to salvage wafers left in the load-lock chambers 160. Since the substrate processing apparatus 100 in FIG. 1 includes two load-lock chambers 160M and 160N, the processing in FIG. 7 is executed for a load-lock chamber 160 where a wafer W is left, i.e., either the load-lock chamber 160M or the load-lock chamber 160N, in the substrate processing apparatus 100.

In the load-lock chamber internal wafer salvage processing in FIG. 7, discharge processing is first executed in the load-lock chamber 160 where a wafer W is still present in step S310. As the discharge processing, a cycle purge such as that described earlier through which a cycle made up of evacuation and charging is repeated a predetermined number of times and a purge gas (e.g., $N_2$) is drawn into the load-lock chamber as it is charged, may be executed by controlling the discharge system and the gas supply system of the load-lock chamber 160.

Next, in step S320, the wafer W in the load-lock chamber 160 is transferred into the particle measurement chamber 134 via the transfer unit-side transfer mechanism 170. Namely, after adjusting the pressure in the load-lock chamber 160 to one atmosphere through charging or the like, the transfer unit-side transfer mechanism 170 is engaged to carry out the wafer W and transfer it into the particle measurement chamber 134. In step S330, the wafer undergoes particle measurement, and in step S340, the measurement results are stored into a log or the like. Subsequently, the wafer W is carried out of the particle measurement chamber 134 and returned to the initial cassette container 132 via the transfer unit-side transfer mechanism 170 in step S350. Once the sequence of the wafer salvage processing in the load-lock chamber 160 is completed, the operation returns to the main routine in FIG. 5.

Through the wafer salvage processing in the load-lock chamber 160 executed as described above, any wafer W left in the load-lock chamber 160 is invariably retrieved into the initial cassette container 132 after the particle measurement, as in the case of wafers W left in the transfer unit 120, since the wafer W left in the load-lock chamber 160, which is bound to be either an unprocessed wafer or a wafer in a processing complete state, as any wafer W left in the transfer unit 120 is bound to be, can be directly retrieved without resulting in any problem.

However, before the wafer W is carried out of the load-lock chamber 160, discharge processing (e.g., a cycle purge) is executed for the load-lock chamber 160, since the processing gas from the processing chamber 140 may be lingering on the wafer W or the like in the load-lock chamber 160. In addition, if the operation of the substrate processing apparatus 100 has stopped while the load-lock chamber 160 was being evacuated, a reverse flow of dirt and dust from the discharge side may have occurred. By executing the discharge processing in the load-lock chamber 160, the residual processing gas, dirt, dust and the like can be removed. Furthermore, if the wafer processing is executed by using a corrosive gas (e.g., chlorine or hydrogen chloride) as the processing gas, the discharge processing may be acid discharge processing executed for the load-lock chamber 160. In such a case, the corrosive gas is not allowed to flow out toward the transfer unit 120, thereby effectively preventing corrosion of the parts constituting the transfer unit 120, the transfer unit-side transfer mechanism 170 and the like.

(Common Transfer Chamber Internal Wafer Salvage Processing)

Figure 8:
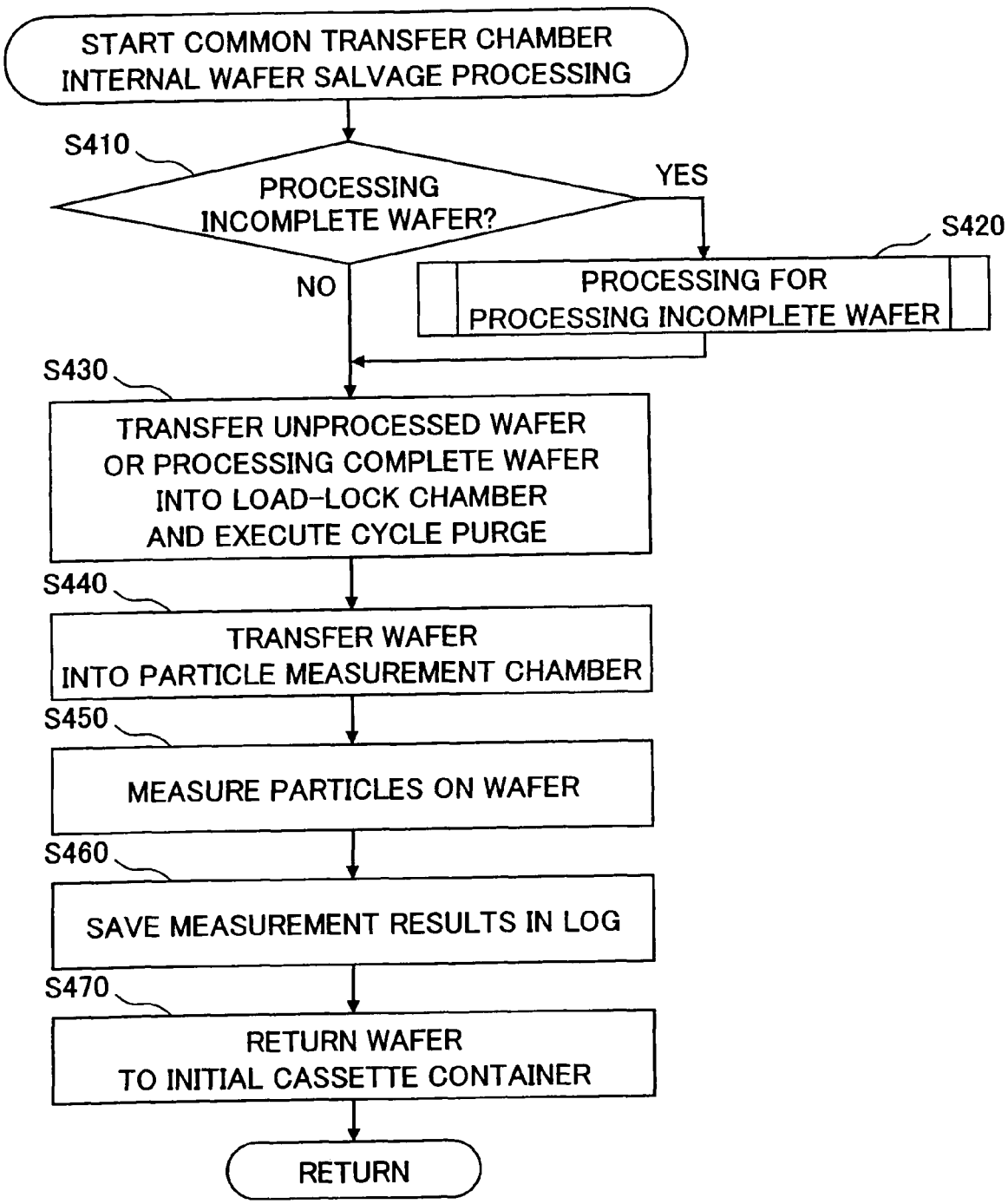
FIG. 8 presents a flowchart of a specific example of the common transfer chamber internal wafer salvage processing in FIG. 5.

Next, in reference to FIG. 8, a specific example of the wafer salvage processing for a wafer left in the common transfer chamber 150 (executed in step S400) is explained. FIG. 8 presents a flowchart of a wafer salvage processing subroutine executed to salvage a wafer left inside the common transfer chamber 150. A wafer left in the common transfer chamber 150 may be an unprocessed wafer W that has not been processed at all in any of the processing chambers 140 or a processed wafer W having undergone processing in at least one processing chamber 140. Moreover, the processed wafer W may be a processing complete wafer having undergone the processing in all the processing chambers 140 or it may be a processing incomplete wafer W needing to be processed continuously in a plurality of processing chambers 140 and yet to undergo processing in some of the processing chambers 140. Accordingly, the wafer salvage processing in the common transfer chamber 150 is executed in correspondence to the specific processing stage detected for the wafer W.

In the common transfer chamber internal wafer salvage processing in FIG. 8, a decision is made in step S410 as to whether or not the wafer W in the common transfer chamber 150 is a processing incomplete wafer W. More specifically, the processing stage of the wafer W in the common transfer chamber 150 is detected based upon the wafer processing history information 294 in FIG. 4 and a decision is made as to whether or not the wafer W is in a processing incomplete state. For instance, if a wafer W needing to be processed in the first processing chamber 140A and the second processing chamber 140B is left in the common transfer chamber 150 after having undergone the processing in the first processing chamber 140A, it is yet to undergo the processing in the second processing chamber 140B and accordingly, the wafer W is judged to be in a processing incomplete state.

If the wafer W in the common transfer chamber 150 is judged to be a processing incomplete wafer W in step S410, processing for a processing incomplete wafer W is executed in step S420 before the operation proceeds to step S430. It is to be noted that the processing executed for the processing incomplete wafer W in step S420 is to be described in detail later. If, on the other hand, it is decided in step S410 that the wafer W in the common transfer chamber 150 is not a processing incomplete wafer W, i.e., if it is determined to be either an unprocessed wafer W or a processing complete wafer W, the operation proceeds to step S430.

In step S430, the wafer W, which is either an unprocessed wafer W or a processing complete wafer W, is carried into the load-lock chamber 160M or 160N via the processing unit-side transfer mechanism 180, and then discharge processing, e.g., a cycle purge such as that described earlier, is executed inside the load-lock chamber 160M or 160N. The term "processing complete wafer W" in this context applies to a processing complete wafer W obtained by processing a processing incomplete wafer W (step S420) through the recovery processing, as well as a processing complete wafer W which has undergone all the necessary processing at the time of the operation stop due to an abnormality in the substrate processing apparatus 100 (or at the time of the recovery processing start).

Next, in step S440, the wafer W is transferred into the particle measurement chamber 134 via the transfer unit-side transfer mechanism 170. Namely, after adjusting the pressure in the load-lock chamber 160M or 160N to one atmosphere through charging with a purge gas or the like, the transfer unit-side transfer mechanism 170 is engaged to carry out the wafer W and transfer it into the particle measurement chamber 134. In step S450, the wafer undergoes particle measurement, and in step S460, the measurement results are stored into a log or the like. Subsequently, the wafer W is carried out of the particle measurement chamber 134 and returned to the initial cassette container 132 via the transfer unit-side transfer mechanism 170 in step S470. Once the sequence of the wafer salvage processing in the common transfer chamber 150 is completed, the operation returns to the main routine in FIG. 5.

(Processing for Processing Incomplete Wafer)

Figure 9:
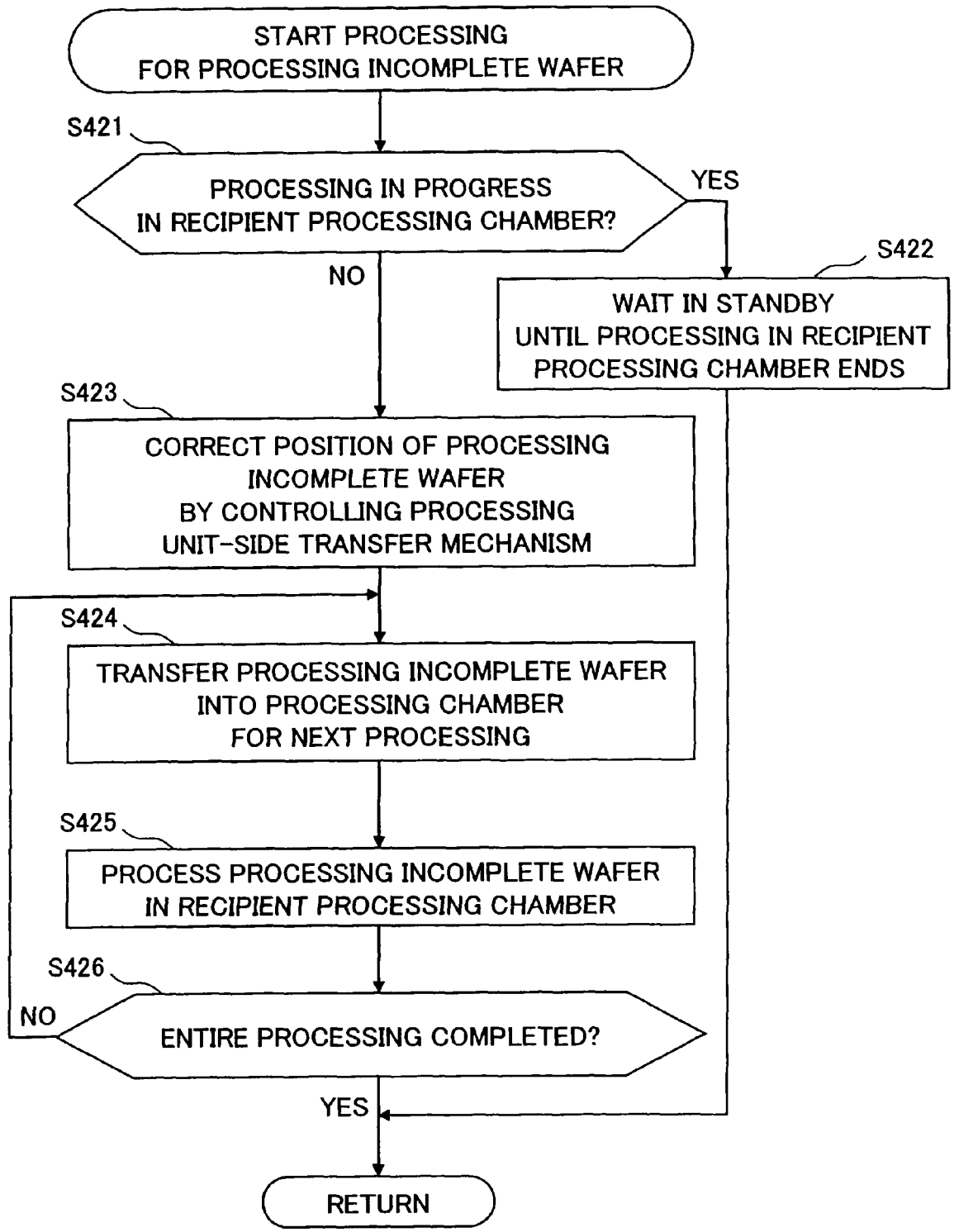
FIG. 9 presents a flowchart of a specific example of processing executed for a wafer in a processing incomplete state in FIG. 8.

Now, in reference to FIG. 9, a specific example of the processing for the processing incomplete wafer W executed in step S420 in FIG. 8 is explained. FIG. 9 presents a flowchart of the processing subroutine executed for the processing incomplete wafer W.

In the processing for the processing incomplete wafer W shown in FIG. 9, a decision is made in step S421 as to whether or not the recipient processing chamber 140 to which the processing incomplete wafer W is to be transferred is currently engaged in the processing of another wafer W. The decision as to whether or not the recipient processing chamber 140 is currently engaged in the processing of another wafer W may be made by, for instance, checking the processing stage of the other wafer W in the wafer processing history information 294 in FIG. 4. If it is decided in step S421 that the processing is in progress at the recipient processing chamber 140, the operation waits in standby in step S422 for the completion of the processing on the other wafer W at the recipient processing chamber 140 before the operation returns to the routine shown in FIG. 8, so as to process the processing incomplete wafer W after the processing on the other wafer W is completed in the recipient processing chamber 140. In more specific terms, the processing incomplete wafer W is held in standby in the common transfer chamber 150 under these circumstances, and thus, as the operation returns to the main routine in FIG. 5 upon ending the routine in FIG. 8, it will be decided in step S150 that there is a wafer W yet to be retrieved. Accordingly, the processing in step S400, i.e., the subroutine in FIG. 9, will be executed again. If the processing on the other wafer W in the recipient processing chamber has ended by this time, the processing incomplete wafer W having been held in standby in the common transfer chamber 150 will be processed in step S423 and subsequent steps.

If, on the other hand, it is decided in step S421 that the recipient processing chamber 140 is not currently engaged in processing, the position of the processing incomplete wafer W is corrected by controlling the processing unit-side transfer mechanism 180 in step S423. The positional correction is executed in this step, since the position of the wafer W held on an end-effector of the processing unit-side transfer mechanism 180 may have shifted if the operation stop at the substrate processing apparatus 100 has caused an abrupt stop the processing unit-side transfer mechanism 180 engaged in transfer operation. If the wafer W were carried into the processing chamber 140 in a misaligned state, the wafer W might become caught at the gate valve 144 or might be off-centered on the stage 142 in the processing chamber 140. In order to prevent such misalignment of the wafer W, the position of the wafer W is corrected before it is carried into the processing chamber 140.

The positional correction for the wafer W may be executed as described below by using, for instance, the position sensor 189 disposed inside the common transfer chamber 150. Namely, the processing unit-side transfer mechanism 180 carries the wafer W held on its end-effector to the position sensor 189 which then detects the extent of misalignment of the wafer W. Then, the position of the wafer W is corrected by adjusting the position of the end-effector at the processing unit-side transfer mechanism 180 in correspondence to the extent of misalignment detected by the position sensor 189.

Next, in step S424, the processing incomplete wafer W having undergone the positional correction is carried to the processing chamber 140 where it is to undergo the next processing via the processing unit-side transfer mechanism 180. In step S425, the processing incomplete wafer W is processed in the recipient processing chamber 140.

Then, in step S426, a decision is made as to whether or not the wafer has undergone all the processing. If the subject wafer needs to be processed in a plurality of processing chambers 140, this decision is made by judging whether or not the entire processing for the wafer W in the plurality of processing chambers 140 has been completed. If it is decided in step S426 that the entire processing has not been completed yet, the operation returns to step S424 for the execution of the remaining processing. If, on the other hand, it is decided in step S426 that the entire processing has been completed, the sequence of processing for the processing incomplete wafer ends and the operation returns to the routine shown in FIG. 8.

Through the wafer salvage processing in the common transfer chamber 150 described above, if the wafer W left in the common transfer chamber 150 is in a processing complete state, the wafer W is retrieved into the initial cassette container 132 after executing the discharge processing of the load-lock chamber 160 and the particle measurement. If, on the other hand, the wafer W left in the common transfer chamber 150 is in a processing incomplete state, the remaining processing in the other processing chambers is executed to complete the entire processing sequence and then the wafer is retrieved into the initial cassette container 132. This means that a processing incomplete wafer W is never directly retrieved into the cassette container 132 which is at atmospheric pressure and that the processing incomplete wafer W never becomes unsalvageable due to exposure to the outside atmosphere. By executing the optimal salvage processing as described above in correspondence to the specific processing stage of each wafer W, the maximum number of substrates can be salvaged.

(Processing Chamber Internal Wafer Salvage Processing)

Figure 10:
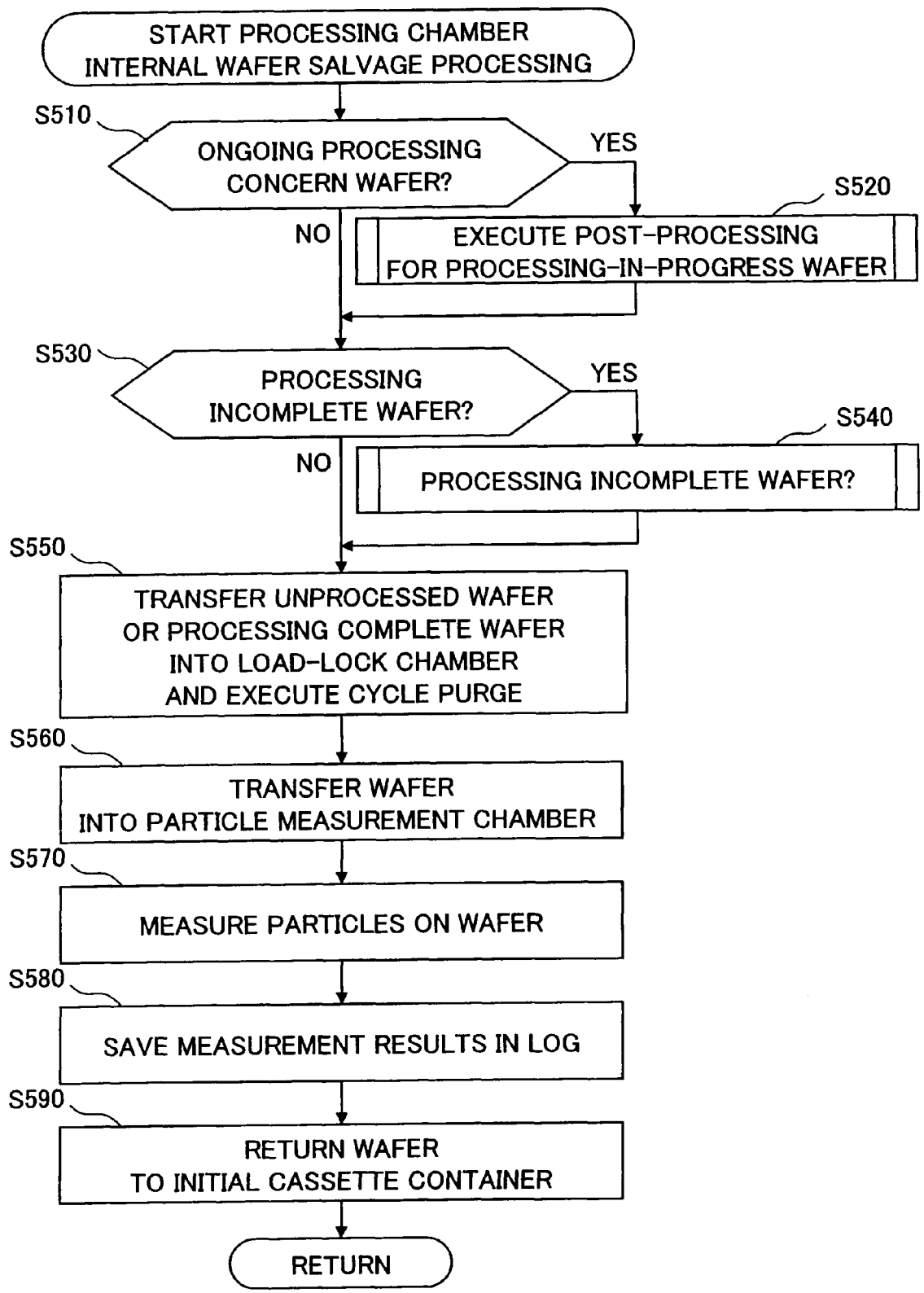
FIG. 10 presents a flowchart of a specific example of the processing chamber internal wafer salvage processing in FIG. 5.

Next, in reference to FIG. 10, a specific example of the wafer salvage processing for wafers left in the processing chambers 140 is explained. FIG. 10 presents a flowchart of the wafer salvage processing subroutine executed to salvage wafers left in the processing chambers 140. The substrate processing apparatus 100 in FIG. 1 includes six processing chambers 140A through 140F and, accordingly, the processing in FIG. 10 is executed in the substrate processing apparatus 100 for any of the processing chambers 140A through 140F where a wafer W is left.

A wafer W left in a processing chamber 140 may be an unprocessed wafer W having been carried into the processing chamber 140 but yet to undergo the processing therein, a processed wafer W, which may be a processing incomplete wafer W or a processing complete wafer W having undergone the processing in the processing chamber 140 and waiting to be carried out of the processing chamber 140 or a processing-in-progress wafer W, the processing of which has started in the processing chamber 140 and has been halted. The contents of the salvage processing executed for a processing-in-progress wafer W vary depending upon the specific processing stage (e.g., the stabilizing step, the etching step or the terminating step to be detailed later) in progress in the processing chamber 140 at the time of the operation stop of the substrate processing apparatus 100. In other words, the wafer salvage processing in the processing chamber 140 is executed in correspondence to the processing stage of the wafer W left in the processing chamber 140.

In the wafer salvage processing in the processing chamber 140 in FIG. 10, a decision is made in step S510 as to whether or not the wafer W left in the processing chamber 140 is a processing-in-progress wafer W. This decision may be made by judging whether or not the wafer W is a processing-in-progress wafer based upon the processing stage of the wafer W in the processing chamber 140 indicated in the wafer processing history information 294 in FIG. 4. For instance, the wafer processing history information 294 in FIG. 4 indicates that the etching process on the wafer W assigned with wafer ID 132A-22 was in progress in the first processing chamber 140A at the time of the operation stop at the substrate processing apparatus 100 and, accordingly, the wafer W is judged to be a processing-in-progress wafer.

If it is decided in step S510 that the wafer W left in the processing chamber 140 is a processing-in-progress wafer W, the processing-in-progress wafer W is processed in step S520 before the operation proceeds to step S530. It is to be noted that the processing executed in step S520 for the processing-in-progress wafer W is to be described in detail later. If, on the other hand, it is decided in step S510 that the wafer W left in the processing chamber 140 is not a processing-in-progress wafer W, e.g., if the wafer W is judged to be an unprocessed wafer W or a processed wafer W, the operation directly proceeds to step S530.

In step S530, a decision is made as to whether or not the wafer W in the processing chamber 140 is a processing incomplete wafer W. The term "processing incomplete wafer W" as used in this context may refer to a wafer W, the processing of which is incomplete at the time of the operation stop due to an abnormality in the substrate processing apparatus 100 (or at the time of the recovery processing start), or a processing-in-progress wafer W having undergone the processing in step S520, which still needs to be processed in another processing chamber 140.

If it is decided in step S530 that the wafer W in the processing chamber 140 is a processing incomplete wafer W, it undergoes the processing for the processing incomplete wafer W in step S540, before the operation proceeds to step S550. It is to be noted that the processing executed in step S540 for the processing incomplete wafer W is similar to the processing executed in step S420 in FIG. 8, and a specific example of such processing will be similar to that presented in FIG. 9. If, on the other hand, it is decided in step S530 that the wafer W in the processing chamber 140 is not a processing incomplete wafer W, i.e., if the wafer W is judged to be an unprocessed wafer W or a processing complete wafer W, the operation proceeds to step S550.

In step S550, the wafer W, which is either in an unprocessed state or in a processing complete state, is transferred by, for instance, the processing unit-side transfer mechanism 180 into the load-lock chamber 160M or 160N and then discharge processing such as the cycle purge described earlier is executed inside the load-lock chamber 160M or 160N. The processing complete wafer W transferred into the load-lock chamber during this process may be a processing incomplete wafer W subsequently having undergone the processing step S540 and thus having become a processing complete wafer W, instead of a processing complete wafer W having undergone all the processing at the time of the operation stop due to an abnormality in the substrate processing apparatus 100 (or at the time of recovery processing start).

Next, in step S560, the wafer W is transferred into the particle measurement chamber 134 via the transfer unit-side transfer mechanism 170. Namely, after adjusting the pressure in the load-lock chamber 160M or 160N to one atmosphere through charging with a purge gas or the like, the transfer unit-side transfer mechanism 170 is engaged to carry out the wafer W and transfer it into the particle measurement chamber 134. In step S570, the wafer undergoes particle measurement, and in step S580, the measurement results are stored into a log or the like. Subsequently, the wafer W is carried out of the particle measurement chamber 134 and returned to the initial cassette container 132 via the transfer unit-side transfer mechanism 170 in step S590. Once the sequence of the wafer salvage processing in the processing chamber 140 is completed, the operation returns to the main routine in FIG. 5.

(Processing for Processing-in-Progress Wafer)

Figure 11:
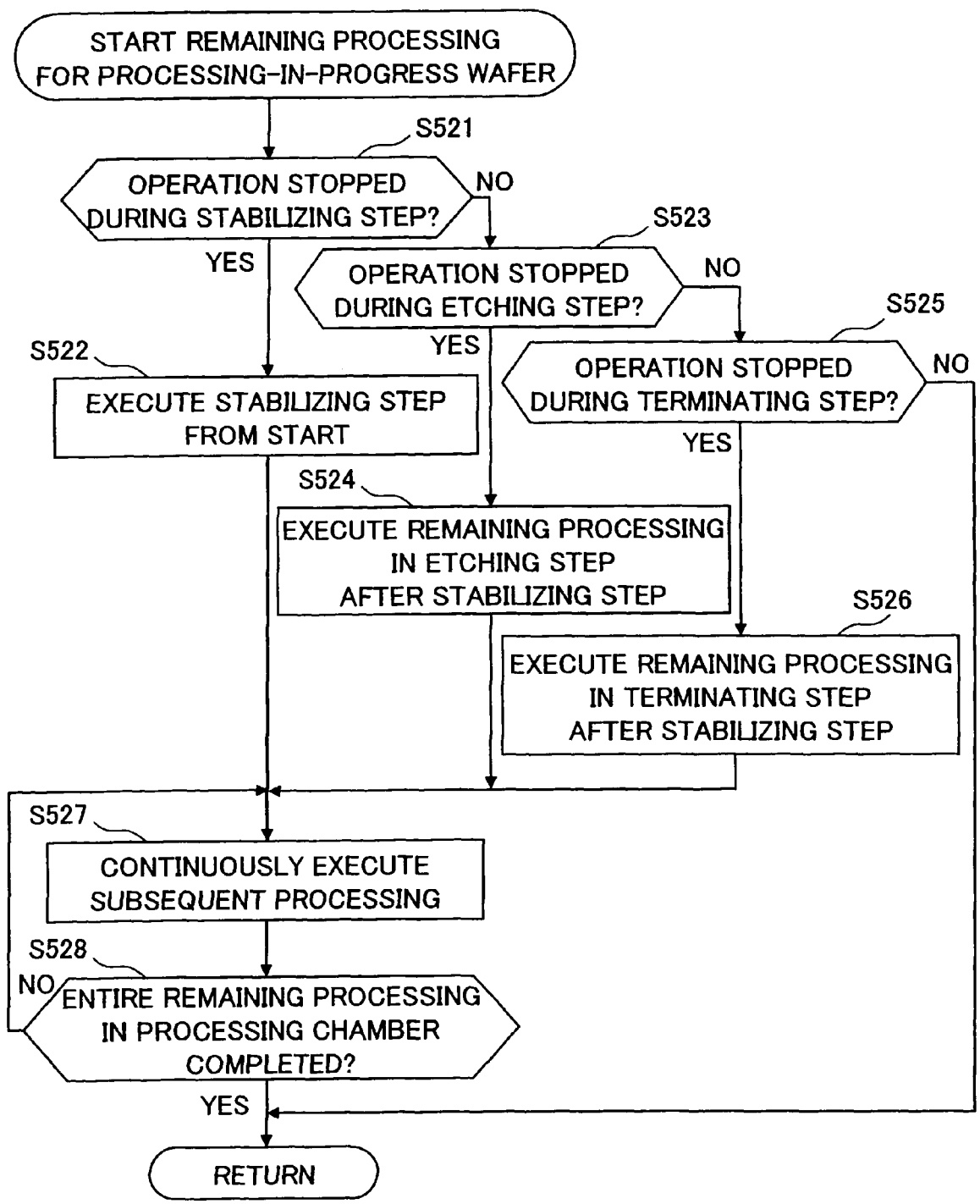
FIG. 11 presents a flowchart of a specific example of the processing executed for a processing-in-progress wafer in FIG. 10.

In reference to FIG. 11, a specific example of the processing executed in step S520 in FIG. 10 for the processing-in-progress wafer W is explained. FIG. 11 presents a flowchart of the processing subroutine executed on the processing-in-progress wafer W. Through the subroutine processing for the processing-in-progress wafer W shown in FIG. 11, the salvage processing is executed in correspondence to the wafer processing step having been interrupted by the operation stop of the substrate processing apparatus 100 due to an abnormality therein. Namely, since a wafer W is normally processed in the processing chamber 140 in steps each corresponding to one of a plurality of processing steps (process recipe), the optimal wafer salvage processing corresponding to the specific processing stage of the wafer W can be achieved by executing the remainder of the processing based upon the specific processing step having been interrupted by the operation stop.

Figure 12A:
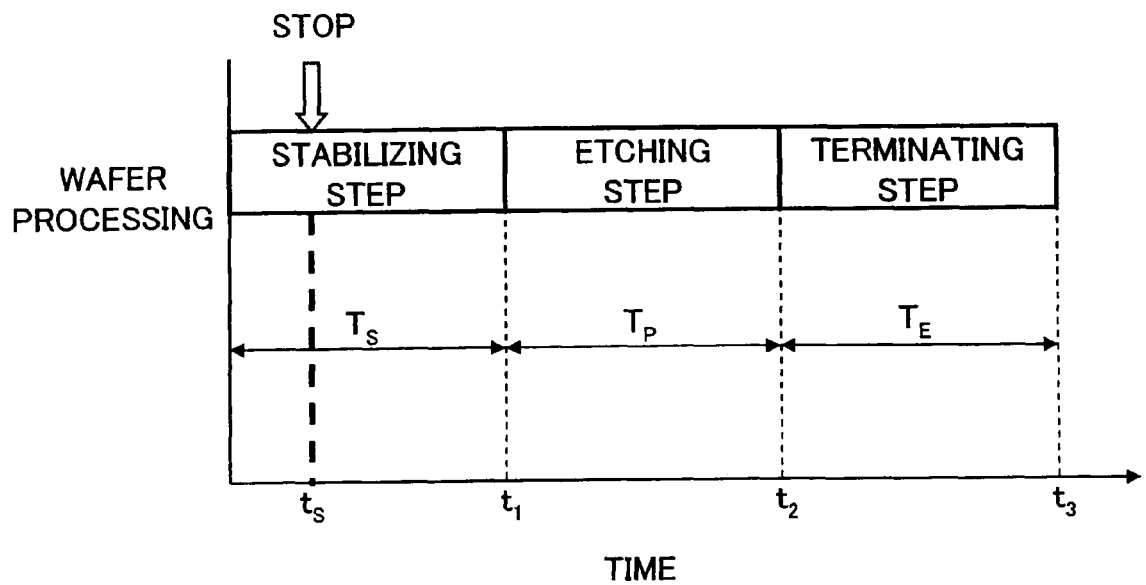
FIG. 12 shows wafer processing steps, with FIG. 12A presenting an example in which the operation of the substrate processing apparatus is stopped while the stabilizing step is in progress inside the processing chamber and FIG. 12B showing the remaining processing that the wafer W still needs to undergo when the operation of the substrate processing apparatus stops while the stabilizing step is in progress in the processing chamber.
Figure 12B:
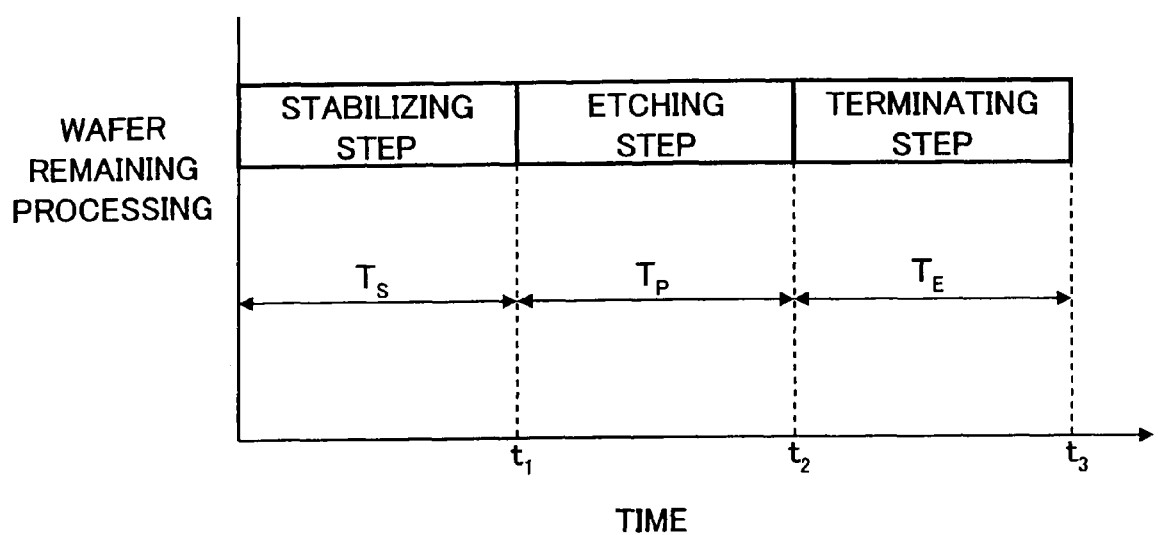
Figure 13A:
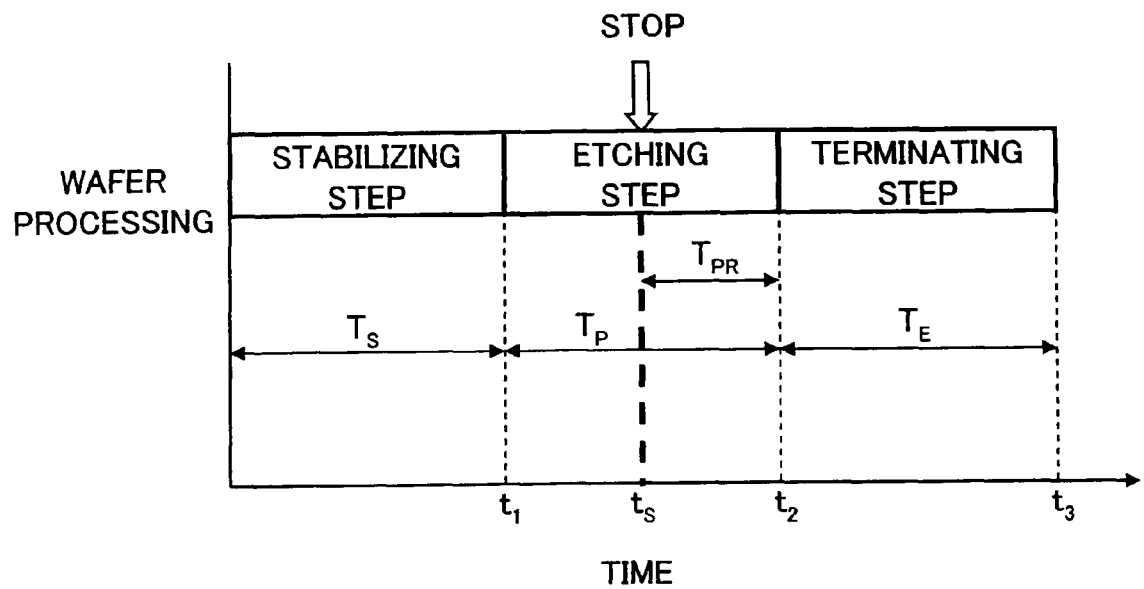
FIG. 13 shows wafer processing steps, with FIG. 13A presenting an example in which the operation of the substrate processing apparatus is stopped while the etching step is in progress inside the processing chamber and FIG. 13B showing the remaining processing that the wafer W still needs to undergo when the operation of the substrate processing apparatus stops while the etching step is in progress in the processing chamber.
Figure 13B:
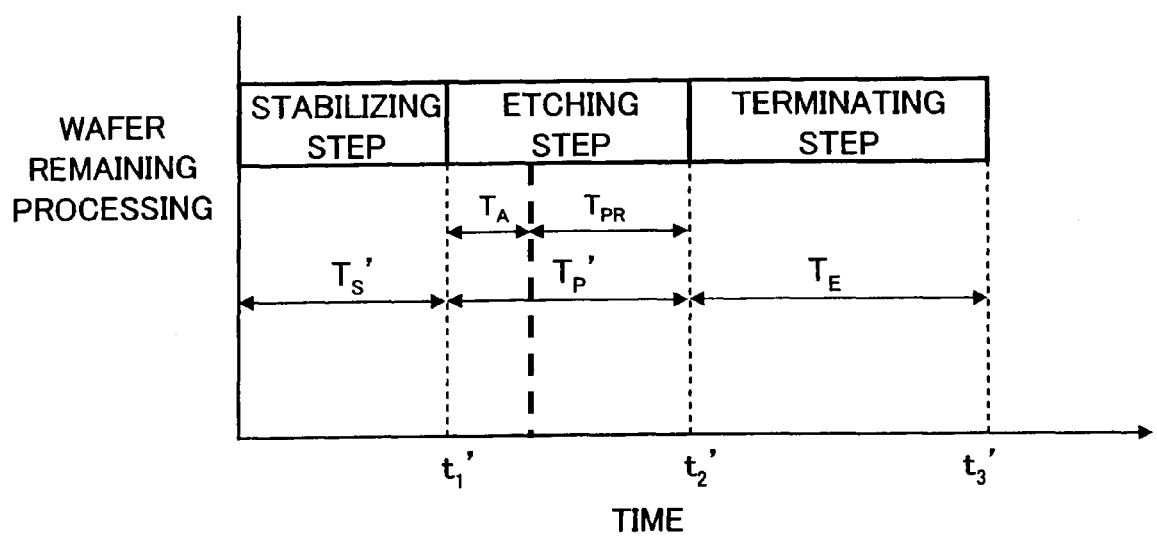
Figure 14A:
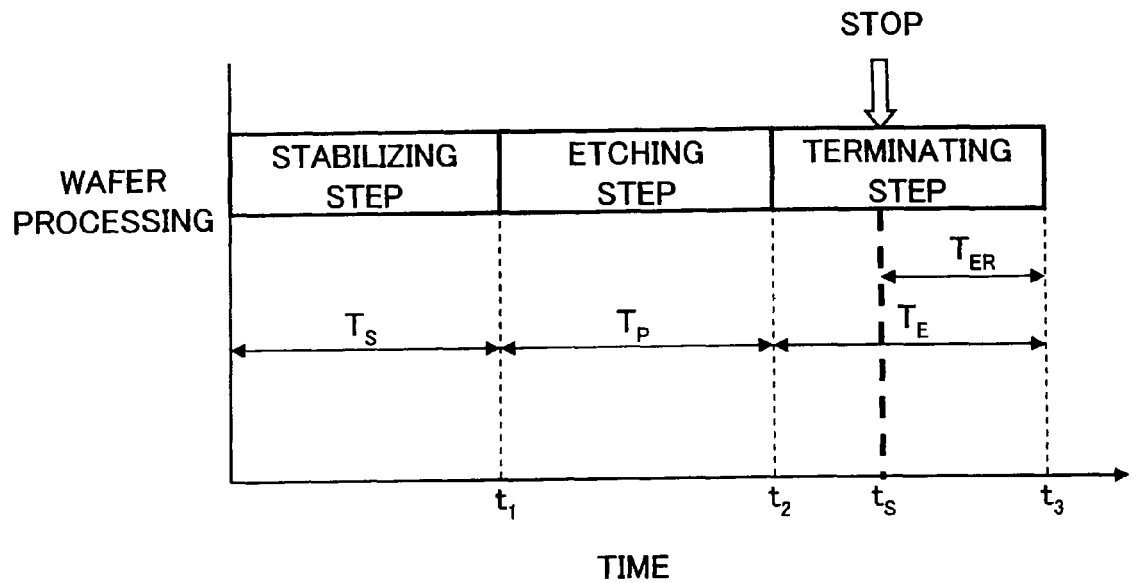
FIG. 14 shows wafer processing steps, with FIG. 14A presenting an example in which the operation of the substrate processing apparatus is stopped while the terminating step is in progress inside the processing chamber and FIG. 14B showing the remaining processing that the wafer W still needs to undergo when the operation of the substrate processing apparatus stops while the terminating step is in progress in the processing chamber.
Figure 14B:
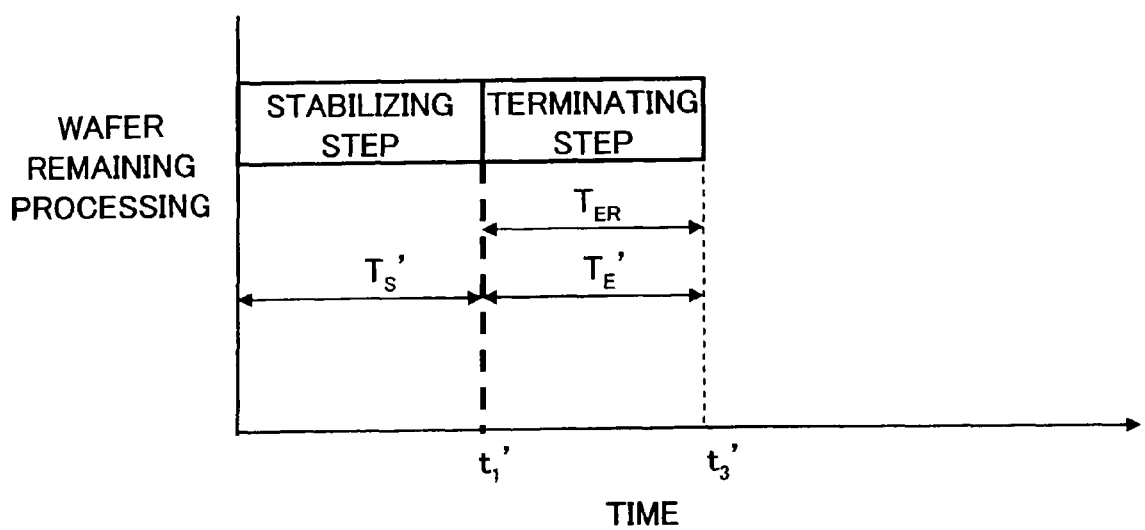

While the contents of the wafer processing steps (process recipe) in the processing chamber 140 vary depending upon the type of processing the wafer W undergoes and the conditions under which the processing is executed in the processing chamber 140, an explanation is given on a specific example in which the wafer W is etched through a stabilizing step $T_S$, an etching step $T_P$ and a terminating step $T_E$, as shown in FIGS. 12 through 14. FIGS. 12 through 14 each indicate $T_S$, $T_P$ and $T_E$ representing the lengths of time required to execute the stabilizing step, the etching step and the terminating step. FIGS. 12 through 14 show different time points at which the operation stop of the substrate processing apparatus 100 occurs while the wafer processing is in progress. FIGS. 12A through 14A each indicate a specific wafer processing step interrupted by the operation stop of the substrate processing apparatus 100, whereas FIGS. 12B through 14B each indicate the remaining processing that the wafer W needs to undergo following the operation stop of the substrate processing apparatus 100 having occurred as indicated in FIG. 12A, 13A or 14A.

In the processing for the processing-in-progress wafer W in FIG. 11, a decision is made in step S521 as to whether or not the processing of the processing-in-progress wafer W in the processing chamber 140 has been halted during the stabilizing step. This decision may be made by judging whether or not the wafer processing has been halted during the stabilizing step based upon the processing stage of the wafer W left in the processing chamber 140, which is indicated in the wafer processing history information 294 in FIG. 4. If it is decided in step S521 that the processing of the processing-in-progress wafer W in the processing chamber 140 has been halted during the stabilizing step, the stabilizing step is re-executed from the beginning in step S522.

If the wafer W has been halted during the stabilizing step, as shown in FIG. 12A, for instance, the wafer W has not been etched yet. Accordingly, the stabilizing step should be simply re-executed from the start, as shown in FIG. 12B, as the remaining processing for such a processing-in-progress wafer W.

Once the processing in step S522, i.e., the stabilizing step, ends, the subsequent processing is continuously executed in step S527, a decision is made in step S528 as to whether or not the remaining processing in the processing chamber 140 has been completed, and the operation returns to step S527 and it is decided that the remaining processing has not been completed. In the remaining processing for the processing-in-progress wafer W shown in FIG. 12B, the etching step $T_P$ and the terminating step $T_E$ are executed in succession following the stabilizing step. Once all the steps are executed, the state inside the processing chamber 140 is regulated through discharge processing, pressure control and the like and the processed wafer W is then carried out. When it is decided in step S528 that the remaining processing in the processing chamber 140 has been completed, the sequence of processing for the processing-in-progress wafer ends and the operation returns to the processing chamber internal wafer salvage processing shown in FIG. 10.

If it is decided in step S521 that the processing has not been halted while the processing-in-progress wafer W in the processing chamber 140 was undergoing the stabilizing step, a decision is made in step S523 as to whether or not the processing of the processing-in-progress wafer W in the processing chamber 140 has been halted during the etching step. This decision may be made by judging whether or not the wafer processing has been halted during the etching step based upon the processing stage of the wafer W left in the processing chamber 140, which is indicated in the wafer processing history information 294 in FIG. 4. For instance, the wafer processing history information 294 in FIG. 4 indicates that the etching process on the wafer W assigned with wafer ID 132A-22 was in progress in the first processing chamber 140A at the time of the operation stop at the substrate processing apparatus 100 and, accordingly, the wafer W is judged to have been undergoing the etching step when the processing was interrupted.

If it is decided in step S523 that the processing of the processing-in-progress wafer W has been halted while it was undergoing the etching step inside the processing chamber 140, the remainder of the etching step is executed after stabilizing the processing chamber in step S524. Namely, discharge processing is first executed inside the processing chamber 140 and then the processing chamber 140 is evacuated to set the pressure inside the processing chamber 140 to a predetermined level. Once the pressure inside the processing chamber 140 is stabilized, the processing gas is drawn in again, it is raised to plasma by applying high-frequency power and the wafer is etched over the remaining length of time.

For instance, if the processing has been halted while the etching step was in progress, as shown in FIG. 13A, the wafer W will have been partially etched and thus, it only needs to be etched over the remaining etching time $T_{PR}$. However, the state of the plasma raised from the newly drawn in processing gas after the etching process was halted and then the discharge processing was executed as part of the stabilizing step may not exactly replicate the plasma state prior to the interruption of the etching process. For this reason, an additional length of etching time $T_A$ is set when resuming the remaining processing of the wafer W, as shown in FIG. 13B. Thus, in the postprocessing of the wafer W in FIG. 13B, the wafer W is etched over the length of time matching the sum of the remaining etching time $T_{PR}$ that was yet to elapse at the time of the operation stop in the substrate processing apparatus 100 due to an abnormality (at the time of the processing interruption) and the additional length of etching time $T_A$. This additional etching time $T_A$ may be freely set in advance in the storage means 290 or the like as a recovery process recipe for the wafer processing steps (process recipe) by performing a specific operation at the input/output means 260, or it may be entered by the operator via the input/output means 260 when executing the recovery processing.

It is to be noted that while an explanation is given above in reference to the embodiment on an example in which the remaining processing for the wafer W is executed by determining the remaining etching time $T_{PR}$ based upon the wafer processing history information 294 shown in FIG. 4 and by etching the wafer over the remaining processing time representing the sum of the remaining etching time $T_{PR}$ and the additional etching time $T_A$ (if necessary), the remaining processing time does not need to be determined based upon the wafer processing history information 294 such as that shown in FIG. 4. For instance, one of the processing chambers 140A through 140F (e.g., the processing chamber 140F) may be designated as a defect inspection chamber. The wafer W, the processing of which has been interrupted while the etching step was in progress, may be transferred into the defect inspection chamber, and the remaining processing time over which the wafer needs to undergo the further etching process (e.g., $T_{PR}+T_A$) may be set based upon the results of a detection of the processing state of the wafer W executed in the defect inspection chamber (e.g., the extent to which the wafer W still needs to be etched at the hole bottom formed through the earlier etching process). The defect inspection chamber may be equipped with, for instance, an inspection device such as an electron microscope, and in such a case, the processing state of the wafer W may be detected by checking an electronic image of the wafer W in the defect inspection chamber captured via the electron microscope or the like.

In addition, while the stabilizing step $T_S$ set in advance as a wafer processing step (in the process recipe) may be executed as the stabilizing step prior to the etching step under these circumstances, a stabilizing step $T_S'$ specifically set (in the process recipe) as part of the wafer salvage processing may be executed instead. In such a case, the high-frequency voltage applied to, for instance, the lower electrode or the like may be applied in steps. When a particularly high-frequency voltage needs to be applied, the generation of particles inside the processing chamber 140 can be effectively prevented by applying the voltage in steps. A specific high-frequency voltage application method may be set in correspondence to the value of the voltage to be raised in steps and the length of time over which the voltage is to be applied.

Once the processing in step S524, i.e., the remaining processing in the etching step, ends, the subsequent processing is continuously executed in step S527, a decision is made in step S528 as to whether or not all the remaining processing in the processing chamber 140 has been completed, and the operation returns to step S527 if it is decided that all the remaining processing has not been completed. In the subsequent processing for the processing-in-progress wafer W shown in FIG. 13B, the terminating step $T_E$ is executed following the etching step. Once all the steps are executed, the state inside the processing chamber 140 is regulated through discharge processing, pressure control and the like and the processed wafer W is then carried out. When it is decided in step S528 that the remaining processing in the processing chamber 140 has been completed, the sequence of processing for the processing-in-progress wafer ends and the operation returns to the processing chamber internal wafer salvage processing shown in FIG. 10.

If it is decided in step S523 that the processing has not been halted while the processing-in-progress wafer W in the processing chamber 140 was undergoing the etching step, a decision is made in step S525 as to whether or not the processing of the processing-in-progress wafer W in the processing chamber 140 has been halted during the terminating step. This decision may be made by judging whether or not the wafer processing has been halted during the etching step based upon the processing stage of the wafer W left in the processing chamber 140, which is indicated in the wafer processing history information 294 in FIG. 4.

If it is decided in step S525 that the processing of the processing-in-progress wafer W has been halted while it was undergoing the terminating step inside the processing chamber 140, the remainder of the terminating step is executed after stabilizing the processing chamber in step S526. Namely, discharge processing is first executed inside the processing chamber 140 and then the processing chamber 140 is evacuated to set the pressure inside the processing chamber 140 to a predetermined level. Once the pressure inside the processing chamber 140 is stabilized, the processing gas is drawn in again, it is raised to plasma by applying high-frequency power and the terminating step including end point processing is executed over the remainder of the time.

If the processing has been halted while the terminating step was in progress, as shown in FIG. 14A, the end point processing in the terminating step is executed over the remaining length of time $T_{ER}$. Namely, the etching process having started in the immediately preceding etching step is terminated at a time point at which the remaining processing time $T_{ER}$ of the terminating step expires.

Once the processing in step S525, i.e., the terminating step, ends, the subsequent processing is continuously executed in step S527, a decision is made in step S528 as to whether or not the remaining processing in the processing chamber 140 has been completed, and the operation returns to step S527 and it is decided that the remaining processing has not been completed. In the postprocessing for the processing-in-progress wafer W shown in FIG. 14B, all the steps are completed as the terminating step ends. Once all the steps are executed, the state inside the processing chamber 140 is regulated through discharge processing, pressure control and the like and the processed wafer W is then carried out. When it is decided in step S528 that the remaining processing in the processing chamber 140 has been completed, the sequence of processing for the processing-in-progress wafer ends and the operation returns to the processing chamber internal wafer salvage processing shown in FIG. 10.

The end point processing described above may be executed by adopting any of various methods. For instance, the etching process may end at an end point at which a predetermined length of ending period expires (a first end point processing method), or may end at an end point detected through an end point detection executed based upon the plasma condition or the like (a second end point processing method). Alternatively, a third end point processing method, whereby the etching process ends at the time point at which an end point is detected through the end point detection method mentioned above or the etching process is terminated when a predetermined length of ending period elapses if no end point is detected, may be adopted. The end point may be detected based upon the change in the light emission spectrum of plasma excited within the processing chamber 140 or based upon the change in the interference of the light reflected from the wafer w by radiating light from a light source onto the wafer W.

The wafer salvage processing in FIG. 11 achieved in the embodiment may be adopted in the terminating step regardless of which specific end point processing is executed as part thereof. For instance, if the end point is determined as the time point at which a predetermined length of ending period expires, as in the first end point processing method or the third end point processing method, the remaining processing time $T_{ER}$ of the terminating step can be determined based upon the predetermined ending period (e.g., $T_E$ in FIG. 14) as long as the time point of the operation stop ts is ascertained. Accordingly, the etching process is terminated at the end point at which the remaining processing time $T_{ER}$ in the terminating step elapses, as explained earlier. Under such circumstances, the end point detection based upon the plasma condition or the like is not executed in the third end point processing method.

If, on the other hand, the second end point processing method is adopted, the end point for the etching process is detected entirely based upon the state of the plasma or the wafer condition, which means that no specific length of time is set in advance as the ending period (e.g., $T_E$ in FIG. 14) to determine the end point as described above. Under these circumstances, the lengths of ending period may be measured while individual wafers W undergo the terminating step, the measured data may be stored in memory or the like, the average of the lengths of ending period corresponding to the wafers W having been processed thus far may be designated as the length of the ending period for the wafer W undergoing the salvage processing in the event of an operation stop of the substrate processing apparatus 100 due to an abnormality therein, and the remaining processing time $T_{ER}$ to elapse in the terminating step may then be calculated based upon this length of ending period.

In addition, while the stabilizing step $T_S$ set in advance as the wafer processing step (in the process recipe) may be executed as the stabilizing step prior to the terminating step under these circumstances, a stabilizing step $T_S'$ specifically set (in the process recipe) in conjunction with the wafer salvage processing may be executed instead. In such a case, the high-frequency voltage applied to, for instance, the lower electrode may be applied in steps.

As the sequence of the wafer salvage processing in the processing chamber 140 ends as described above, the operation returns to the main routine processing in FIG. 5. Namely, in step S150 in FIG. 5, a decision is made as to whether or not all the wafers W having been in the process of being transferred have been retrieved. In other words, a decision is made as to whether or not all the wafers W having undergone the wafer salvage processing in steps S200 through S500 have been transferred and retrieved into the initial cassette container 132. If it is decided in step S150 that not all the wafers W have been retrieved yet, the operation returns to step S110, whereas if it is decided that all the wafers W have been retrieved, the operation shifts into the subsequent apparatus internal state restoration processing (steps S160 and S170).

(Apparatus Internal State Restoration Processing)

In the recovery processing in FIG. 5, the apparatus internal state restoration processing is executed by, for instance, cleaning the inside the various chambers in the substrate processing apparatus 100. Namely, cleaning processing is executed inside the transfer unit 120, the common transfer chamber 150, the load-lock chambers 160M and 160N, the processing chambers 140A through 140F and the like in step S160. The chambers may be cleaned by repeatedly executing a cycle made up of evacuation and charging to switch between a vacuum and atmospheric pressure a predetermined number of times while drawing in a purge gas such as $N_2$. Through the cleaning processing, particles present in the individual chambers are removed, thereby regulating the states inside the chambers so as to achieve wafer processing enabled conditions. It is to be noted that processing other than that described above may be executed as the cleaning processing, and another type of cleaning processing of the known art may be executed as long as it can be automatically executed in the substrate processing apparatus.

Next, processing for measuring the quantities of particles in the individual chambers is executed in step S170. For instance, assuming that particle measurement wafers are stored in the cassette container 132C, particle measurement wafers are first taken out of the cassette container 132C and are carried into the individual chambers. Subsequently, they are each carried into the particle measurement chamber 134 where the quantity of particles deposited on the particular particle measurement wafer is measured. Then, the results of the measurement of the quantity of particles in the specific chamber are stored in, for instance, a log. Such a log may be stored into the storage means 290 or the memory at the control unit 200.

Once the processing for measuring the quantities of particles present in the individual chambers is completed, any unprocessed wafer having been retrieved into the cassette container 132 undergoes reprocessing. Namely, a decision is made in step S180 as to whether or not there is any unprocessed wafer among the wafers W having been retrieved into the cassette container 132. The decision as to whether or not there is any unprocessed wafer among the wafers W having been retrieved into the cassette container 132 may be made by checking the wafer storage information 292 such as that shown in FIG. 3. The wafer storage information 292 in FIG. 3 indicates "yes" for the recovery processing and "unprocessed" for the wafer processing status with regard to the wafer W assigned with the wafer ID 132A-23 and, accordingly, this wafer can be judged to be an unprocessed wafer that has undergone the recovery processing.

If it is decided in step S180 that there is an unprocessed wafer, the unprocessed wafer undergoes reprocessing in step S190 (reprocessing step for the unprocessed wafer). In this step, based upon the wafer processing information (process recipe) for the unprocessed wafer W, the wafer processing is executed from the start. Since the reprocessing of the unprocessed wafer W is executed after the wafer is first retrieved into the cassette container 132 and the cleaning processing is executed in the chambers of the substrate processing apparatus 100, the unprocessed wafer W can be processed just as it would have been processed if the operation of the substrate processing apparatus 100 had not been stopped. Once the reprocessing of the unprocessed wafer is completed, the sequence of the recovery processing ends.

It is to be noted that while an explanation is given above in reference to the embodiment on an example in which the apparatus internal state restoration processing, e.g., the cleaning processing for the individual chambers, is executed all at once for the various chambers of the substrate processing apparatus 100 after the substrates left in the chambers are retrieved, the present invention is not limited to this example and the substrate retrieval processing and the apparatus internal state restoration processing may be executed individually for each chamber. For instance, the cleaning processing for the processing unit 110 may be executed immediately after the wafer retrieval processing for the processing unit 110 is executed, and the cleaning processing for the common transfer chamber 150 may be executed immediately after the wafer retrieval processing for the common transfer chamber 150 is executed. In addition, the cleaning processing in a processing chamber 140 may be executed while a wafer W is still left therein so as to clean the inside of the processing chamber 140 and, at the same time, remove any particles having been suspended inside the processing chamber 140 when the processing was interrupted and then having fallen onto the wafer W.

Furthermore, the recovery processing achieved in the embodiment may be automatically executed as the power to the substrate processing apparatus is turned on after the abnormality is corrected, or a selection screen that enables a selection as to whether or not the recovery processing is to be executed may be brought up on display at the display means 250 of the control unit 200 so as to allow the operator to select and execute the recovery processing by operating the input/output means 260. In addition, part of the recovery processing may be selectively executed instead of executing the entirety thereof. For instance, either the substrate retrieval processing or the apparatus internal state restoration processing may be selected and executed. Also, a specific part of the substrate retrieval processing such as the transfer unit internal wafer salvage processing (step S200), the load-lock chamber internal wafer salvage processing (step S300), the common transfer chamber internal wafer salvage processing (step S400) or the processing chamber internal wafer salvage processing (step S500) may be selectively executed.

If the operation of the substrate processing apparatus 100 achieved in the embodiment stops due to an abnormality, recovery processing is executed after the abnormality is corrected so as to restore the state of the substrate processing apparatus 100 by automatically retrieving wafers W, each having been left in a chamber of the substrate processing apparatus and having undergone salvage processing corresponding to the extent to which it has been processed at the time of the operation stop, into the cassette container 132 (substrate retrieval step) and restoring the states inside the individual chambers through automatic cleaning processing or the like executed inside the chambers of the substrate processing apparatus 100 (apparatus internal state restoration step). As a result, the length of time and the labor required in the recovery processing for the substrate processing apparatus 100 can be reduced. In addition, as the optimal salvage processing is executed in correspondence to the processing steps of the individual wafers W in the event of an operation stop of the substrate processing apparatus 100 due to an abnormality, the maximum number of wafers W can be salvaged.

It is to be noted that while an explanation is given above in reference to the embodiment on an example in which the recovery processing is executed for the substrate processing apparatus 100 that includes the particle measurement chamber 134, the recovery processing may also be executed for a substrate processing apparatus that is not equipped with a particle measurement chamber 134. In such a case, the measurement of the quantities of particles deposited on wafers W and the quantities of particles in the individual chambers, executed in the particle measurement chamber 134, may be omitted. For instance, step S170 in FIG. 5, steps S210 through S230 in FIG. 6, steps S320 through S340 in FIG. 7, steps S440 through S460 in FIG. 8 and steps S560 through S580 in FIG. 10 may all be omitted.

In addition, the present invention, having been described in detail in reference to the embodiment, may be adopted in a system constituted with a plurality of devices or may be adopted in an apparatus constituted with a single device. It is also obvious that the present invention may be achieved by providing a system or an apparatus with a medium such as a storage medium having stored therein a software program enabling the functions of the embodiment and by reading out and executing the program stored in the medium at the computer (or a CPU or MPU) of the system or the apparatus.

In such a case, the program itself read out from the medium such as a storage medium embodies the functions of the embodiment described above and the medium such as a storage medium having the program stored therein embodies the present invention. The medium such as a storage medium through which the program is provided may be, for instance, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card, or a ROM. Alternatively, such a program may be obtained through a download via a network.

It is to be noted that the scope of the present invention includes an application in which an OS or the like operating on the computer executes the actual processing in part or in whole in response to the instructions in the program read out by the computer and the functions of the embodiments are achieved through the processing thus executed, as well as an application in which the functions of the embodiments are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given above in reference to the embodiment on an example in which the present invention is adopted in a cluster tool-type substrate processing apparatus that includes a processing unit achieved by connecting a plurality of processing chambers around a common transfer chamber, the present invention may also be adopted in any of various types of substrate processing apparatuses in which the operation stops upon the occurrence of an abnormality in the apparatuses, such as a tandem-type substrate processing apparatus achieved by connecting in parallel a plurality of processing units to a transfer unit, with each processing unit having a processing chamber connected to a load-lock chamber.

What is claimed:

1. A substrate processing apparatus that processes a processing target substrate, comprising:

at least one processing chamber where the substrate is processed;

a storage means for storing substrate processing history information with respect to processing executed on the substrate while the substrate processing apparatus is engaged in operation; and a control means for restoring the substrate processing apparatus to an operating state after correcting an abnormality having occurred in the substrate processing apparatus in operation and having resulted in a substrate processing stop, wherein:

said control means executes substrate salvage processing for the substrate left in said processing chamber in correspondence to the extent to which the substrate has been processed at the time of said processing stop detected based upon said processing history information stored in said storage means.

2. The substrate processing apparatus according to claim 1, wherein:

when said processing extent detected for the substrate indicates a processing-underway state in which the substrate is to undergo further processing in said processing chamber, said control means executes the remaining processing on the substrate in the substrate chamber.

3. The substrate processing apparatus according to claim 1, wherein:

when the substrate is detected to be in a processing incomplete state requiring further processing in another processing chamber, said control means executes said processing on the substrate in the other processing chamber.

4. The substrate processing apparatus according to claim 1, wherein:

when said processing extent detected for the substrate indicates a processing-underway state in which the substrate is to undergo further processing in said processing chamber, said control means executes the remaining processing on the substrate in the substrate chamber; and when the substrate is detected to be in a processing incomplete state requiring further processing in another processing chamber, said control means executes said processing on the substrate in the other processing chamber.

5. The substrate processing apparatus according to claim 2, wherein:

the substrate is processed inside said processing chamber through a substrate-processing process executed over three phases (a stabilizing phase, a processing phase and a finishing phase), and said control means determines through detection said processing extent to which the substrate has been processed to be a processing-underway state in a specific phase among said stabilizing phase, the substrate processing phase and said finishing phase, based upon said processing history information stored in said storage means and executes the remaining processing on the substrate in accordance to the processing-underway state having been detected.

6. The substrate processing apparatus according to claim 3, equipped with:

a transfer unit that includes a transfer chamber where the substrate is transferred to/from a substrate storage container for storing the substrate; and a processing unit constituted by connecting a common transfer chamber with said processing chamber to a load-lock chamber connected to said transfer unit.

7. The substrate processing apparatus according to claim 3, equipped with:

a transfer unit that includes a transfer chamber where the substrate is transferred to/from a substrate storage container for storing the substrate; and a processing unit constituted by individually connecting said processing chambers to a plurality of load-lock chambers connected in parallel to said transfer unit.

8. The substrate processing apparatus according to claim 4, equipped with:

a transfer unit that includes a transfer chamber where the substrate is transferred to/from a substrate storage container for storing the substrate; and a processing unit constituted by connecting a common transfer chamber with said processing chamber to a load-lock chamber connected to said transfer unit.

9. The substrate processing apparatus according to claim 4, equipped with:

a transfer unit that includes a transfer chamber where the substrate is transferred to/from a substrate storage container for storing the substrate; and a processing unit constituted by individually connecting said processing chambers to a plurality of load-lock chambers connected in parallel to said transfer unit.

10. The substrate processing apparatus according to claim 5, wherein:

when the substrate is detected to be in the processing-underway state in said stabilizing phase, said control means executes said stabilizing phase completely from the beginning and continues on to execute the substrate processing phase and said finishing phase as the remaining processing on the substrate.

11. The substrate processing apparatus according to claim 5, wherein:

when the substrate is detected to be in the processing-underway state in the substrate processing phase, said control means executes said stabilizing phase and continues on to execute the part of the substrate processing phase that has not yet been executed and said finishing phase as the remaining processing on the substrate.

12. The substrate processing apparatus according to claim 5, wherein:

when the substrate is detected to be in a processing-underway state in said finishing phase, said control means executes said stabilizing phase and then executes the part of said finishing phase that has not yet been executed as the remaining processing on the substrate.

13. The substrate processing apparatus according to claim 11, wherein:

an electrode to which a high-frequency voltage is applied while processing the substrate is installed in said processing chamber, and said stabilizing phase is executed by applying in stages a high-frequency voltage to said electrode based upon voltage values set in steps in advance and lengths of time of voltage application set in advance.

14. The substrate processing apparatus according to claim 11, wherein:

the part of the substrate processing phase that has not yet been executed is executed by executing remaining substrate processing on the substrate over a length of remaining processing time set for the substrate.

15. The substrate processing apparatus according to claim 12, wherein:

an electrode to which a high-frequency voltage is applied while processing the substrate is installed in said processing chamber, and said stabilizing phase is executed by applying in stages a high-frequency voltage to said electrode based upon voltage values set in steps in advance and lengths of time of voltage application set in advance.

16. The substrate processing apparatus according to claim 12, wherein:
the part of said finishing phase that has not yet been executed ends at a terminating point set at a time point at which a remaining time length determined based upon the substrate processing history information stored in said storage means elapses.

17. The substrate processing apparatus according to claim 12, wherein:
the part of said finishing phase that has not yet been executed ends at a terminating point detected based upon a change in a state of plasma generated inside said processing chamber.

18. The substrate processing apparatus according to claim 14, wherein:
the length of remaining processing time is a sum of remaining substrate processing time determined based upon said processing history information regarding the substrate stored in said storage means and additional processing time.

19. The substrate processing apparatus according to claim 14, wherein:
the length of remaining processing time is set based upon a processing status of the substrate.

20. The substrate processing apparatus according to claim 16, wherein:
the part of said finishing phase that has not yet been executed ends at a time point at which a terminating point is detected based upon a change in the state of plasma generated inside said processing chamber and ends at a terminating point matching a time point at which the remaining time elapses without first detecting said terminating point based upon the change in the plasma state.

21. A recovery processing method to be adopted in a substrate processing apparatus equipped with at least one processing chamber where a processing target substrate is processed to restore the substrate processing apparatus to an operating state after correcting an abnormality having occurred in the substrate processing apparatus in operation and having resulted in an operation stop, wherein substrate salvage processing is executed, the method comprising:
a processing extent detection step in which the extent to which the substrate remaining in said processing chamber has been processed at the time of said processing stop is detected based upon processing history information stored in a storage means; and
a substrate salvage step in which substrate salvage processing is executed for the substrate in correspondence to said processing extent having been detected through said processing extent detection step.

22. The recovery processing method to be adopted in a substrate processing apparatus according to claim 21, wherein:
when the substrate is determined to have been processed to an extent that still requires further processing in said processing chamber and thus be in a processing-underway state through said processing extent detection step, remaining processing is executed on the substrate in said processing chamber in said substrate salvage step.

23. The recovery processing method to be adopted in a substrate processing apparatus according to claim 21, wherein:
when the substrate is detected to be in a processing incomplete state requiring further processing in another processing chamber through said processing extent detection step, said processing on the substrate in the other processing chamber is executed in said substrate salvage step.

24. The recovery processing method to be adopted in a substrate processing apparatus according to claim 21, wherein:
when the substrate is determined to have been processed to an extent that still requires further processing in said processing chamber and thus be in a processing-underway state through said processing extent detection step, remaining processing is executed on the substrate in said processing chamber in said substrate salvage step, and
when the substrate is detected to be in a processing incomplete state requiring further processing in another processing chamber through said processing extent detection step, said processing on the substrate in the other processing chamber is executed and said substrate salvage step.

25. The recovery processing method to be adopted in a substrate processing apparatus according to claim 22, wherein:
the substrate is processed inside said processing chamber through a substrate processing process executed over three phases, i.e., a stabilizing phase, a substrate processing phase and a finishing phase,
the processing extent to which the substrate has been processed is determined to be a processing-underway state and a specific phase among said stabilizing phase, said substrate processing phase and said finishing phase based upon said processing history information stored in said storage means in said processing extent detection step, and
the remaining processing is executed on the substrate in said substrate salvage step in accordance to the processing-underway state detected through said processing extent detection step.

26. The recovery processing method to be adopted in a substrate processing apparatus according to claim 23, wherein:
the substrate processing apparatus is equipped with a transfer unit that includes a transfer chamber where the substrate is transferred to/from a substrate storage container for storing the substrate, and a processing unit constituted by connecting a common transfer chamber with said processing chamber to a load-lock chamber connected to said transfer unit.

27. The recovery processing method to be adopted in a substrate processing apparatus according to claim 23, wherein:
the substrate processing apparatus is equipped with a transfer unit that includes a transfer chamber where the substrate is transferred to/from a substrate storage container for storing the substrate, and a processing unit constituted by individually connecting said processing chambers to a plurality of load-lock chambers connected in parallel to said transfer unit.

28. The recovery processing method to be adopted in a substrate processing apparatus according to claim 24, wherein:
the substrate processing apparatus is equipped with a transfer unit that includes a transfer chamber where the substrate is transferred to/from a substrate storage container for storing the substrate, and a processing unit constituted by connecting a common transfer chamber with said processing chamber to a load-lock chamber connected to said transfer unit.

29. The recovery processing method to be adopted in a substrate processing apparatus according to claim 24, wherein:

the substrate processing apparatus is equipped with a transfer unit that includes a transfer chamber where the substrate is transferred to/from a substrate storage container for storing the substrate, and a processing unit constituted by individually connecting said processing chambers to a plurality of load-lock chambers connected in parallel to said transfer unit.

30. The recovery processing method to be adopted in a substrate processing apparatus according to claim 25, wherein:

when the substrate is detected to be in the processing-underway state in said stabilizing phase through said processing extent detection step, said stabilizing phase is executed completely from the beginning and said processing phase and said finishing phase are next executed as the remaining processing on the substrate in said substrate salvage step.

31. The recovery processing method to be adopted in a substrate processing apparatus according to claim 25, wherein:

when the substrate is detected to be in the processing-underway state in said substrate processing phase through said processing extent detection step, said stabilizing phase is executed and the part of said substrate processing phase processing that has not yet been executed and said finishing phase are executed as the remaining processing on the substrate in said substrate salvage step.

32. The recovery processing method to be adopted in a substrate processing apparatus according to claim 25, wherein:

when the substrate is detected to be in a processing-underway state in said finishing phase through said processing extent detection step, said stabilizing phase is executed and the part of said finishing phase that has not yet been executed is then executed as the remaining processing on the substrate in said substrate salvage step.

33. The recovery processing method to be adopted in a substrate processing apparatus according to claim 31, wherein:

an electrode to which a high-frequency voltage is applied while processing the substrate is installed in said processing chamber, and said stabilizing phase is executed by applying in stages a high-frequency voltage to said electrode based upon voltage values set in steps in advance and lengths of time of voltage application set in advance.

34. The recovery processing method to be adopted in a substrate processing apparatus according to claim 31, wherein:

the part of the substrate processing phase that has not yet been executed is executed by executing remaining substrate processing on the substrate over a length of remaining processing time set for the substrate.

35. The recovery processing method to be adopted in a substrate processing apparatus according to claim 32, wherein:

an electrode to which a high-frequency voltage is applied while processing the substrate is installed in said processing chamber, and said stabilizing phase is executed by applying in stages a high-frequency voltage to said electrode based upon voltage values set in steps in advance and lengths of time of voltage application set in advance.

36. The recovery processing method to be adopted in a substrate processing apparatus according to claim 32, wherein:

the part of said finishing phase that has not yet been executed ends at a terminating point set at a time point at which a remaining time length determined based upon the substrate processing history information stored in said storage means elapses.

37. The recovery processing method to be adopted in a substrate processing apparatus according to claim 32, wherein:

the part of said finishing phase that has not yet been executed ends at a terminating point detected based upon a change in a state of plasma generated inside said processing chamber.

38. The recovery processing method to be adopted in a substrate processing apparatus according to claim 34, wherein:

the length of remaining processing time is a sum of remaining substrate processing time determined based upon said processing history information regarding the substrate stored in said storage means and additional processing time.

39. The recovery processing method to be adopted in a substrate processing apparatus according to claim 34, wherein:

the length of remaining processing time is set based upon a processing status of the substrate.

40. The recovery processing method to be adopted in a substrate processing apparatus according to claim 36, wherein:

the part of said finishing phase that has not yet been executed ends at a time point at which a terminating point is detected based upon a change in the state of plasma generated inside said processing chamber and ends at a terminating point matching a time point at which the remaining time elapses without first detecting said terminating point based upon the change in the plasma state.

* * * * *